(12) United States Patent
Smith

(10) Patent No.: US 7,233,887 B2
(45) Date of Patent: Jun. 19, 2007

(54) METHOD OF PHOTOMASK CORRECTION AND ITS OPTIMIZATION USING LOCALIZED FREQUENCY ANALYSIS

(76) Inventor: Bruce W. Smith, 22 Mt. Eagle Dr., Penfield, NY (US) 14526

( * ) Notice: Subject to any disclaimer, the term of this patent is extended or adjusted under 35 U.S.C. 154(b) by 632 days.

(21) Appl. No.: 10/348,031

(22) Filed: Jan. 21, 2003

(65) Prior Publication Data

US 2005/0076321 A1    Apr. 7, 2005

Related U.S. Application Data

(60) Provisional application No. 60/421,686, filed on Oct. 28, 2002, provisional application No. 60/382,400, filed on May 21, 2002, provisional application No. 60/349,451, filed on Jan. 18, 2002.

(51) Int. Cl.
*G06F 17/10* (2006.01)
(52) U.S. Cl. .......................... 703/2; 382/144; 382/145; 382/149; 356/237.1; 356/511; 356/139.07
(58) Field of Classification Search .................. 703/2; 382/144, 145, 149; 356/237.1, 139.07; 219/121.62; 430/5, 311; 355/71, 53; 326/41; 716/19, 716/21, 20
See application file for complete search history.

(56) References Cited

U.S. PATENT DOCUMENTS

| | | | |
|---|---|---|---|
| 4,103,998 A * | 8/1978 | Nakazawa et al. | 356/139.07 |
| 5,242,770 A | 9/1993 | Chen et al. | |
| 5,424,589 A * | 6/1995 | Dobbelaere et al. | 326/41 |
| 5,774,575 A * | 6/1998 | Tanaka et al. | 382/149 |
| 6,118,516 A * | 9/2000 | Irie et al. | 355/53 |
| 6,281,470 B1 * | 8/2001 | Adachi | 219/121.62 |
| 6,525,806 B1 * | 2/2003 | Smith | 355/71 |
| 6,681,379 B2 * | 1/2004 | Pierrat et al. | 716/19 |
| 6,831,997 B2 * | 12/2004 | Kamon | 382/144 |
| 6,925,202 B2 * | 8/2005 | Karklin et al. | 382/145 |
| 6,999,611 B1 * | 2/2006 | Lopez et al. | 382/144 |
| 2002/0001758 A1 * | 1/2002 | Petersen et al. | 430/5 |
| 2002/0004175 A1 * | 1/2002 | Levenson | 430/5 |
| 2002/0005542 A1 * | 1/2002 | Hayano et al. | 257/306 |
| 2002/0015899 A1 * | 2/2002 | Chen et al. | 430/5 |
| 2002/0042007 A1 * | 4/2002 | Miyazaki et al. | 430/5 |
| 2002/0045134 A1 * | 4/2002 | Inoue et al. | 430/311 |
| 2002/0078430 A1 * | 6/2002 | Miyazaki | 716/21 |

(Continued)

FOREIGN PATENT DOCUMENTS

EP    1235103 A2    8/2002

(Continued)

*Primary Examiner*—Paul Rodriguez
*Assistant Examiner*—Kandasamy Thangavelu
(74) *Attorney, Agent, or Firm*—Thomas R. FitzGerald, Esq.; Hiscock & Barclay, LLP

(57) ABSTRACT

A method of level assist feature OPC layout is described using frequency model-based approach. Through low-pass spatial frequency filtering of a mask function, the local influence of zero diffraction energy can be determined. By determining isofocal intensity threshold requirements of an imaging process, a mask equalizing function can be designed. This provides the basis for frequency model-based assist feature layout. By choosing assist feature parameters that meet the requirements of the equalizing function, through-pitch focus and dose matching is possible for large two dimensional mask fields. The concepts introduced also lead to additional assist feature options and design flexibility.

21 Claims, 37 Drawing Sheets

U.S. PATENT DOCUMENTS

| | | | |
|---|---|---|---|
| 2002/0094492 A1* | 7/2002 | Randall et al. | 430/311 |
| 2002/0098421 A1* | 7/2002 | Hasegawa et al. | 430/5 |
| 2002/0131052 A1* | 9/2002 | Emery | 356/511 |
| 2002/0136964 A1* | 9/2002 | Pierrat | 430/5 |
| 2002/0158027 A1* | 10/2002 | Moon et al. | 210/756 |
| 2002/0158214 A1* | 10/2002 | Lin et al. | 250/548 |
| 2002/0171825 A1* | 11/2002 | Krantz et al. | 356/237.1 |
| 2003/0054642 A1* | 3/2003 | Kagotani et al. | 438/689 |

FOREIGN PATENT DOCUMENTS

| | | |
|---|---|---|
| EP | 1241525 A2 | 9/2002 |
| WO | WO 01/37053 A1 | 5/2001 |
| WO | WO 01/61412 A1 | 8/2001 |
| WO | WO 02/05029 A1 | 1/2002 |

* cited by examiner

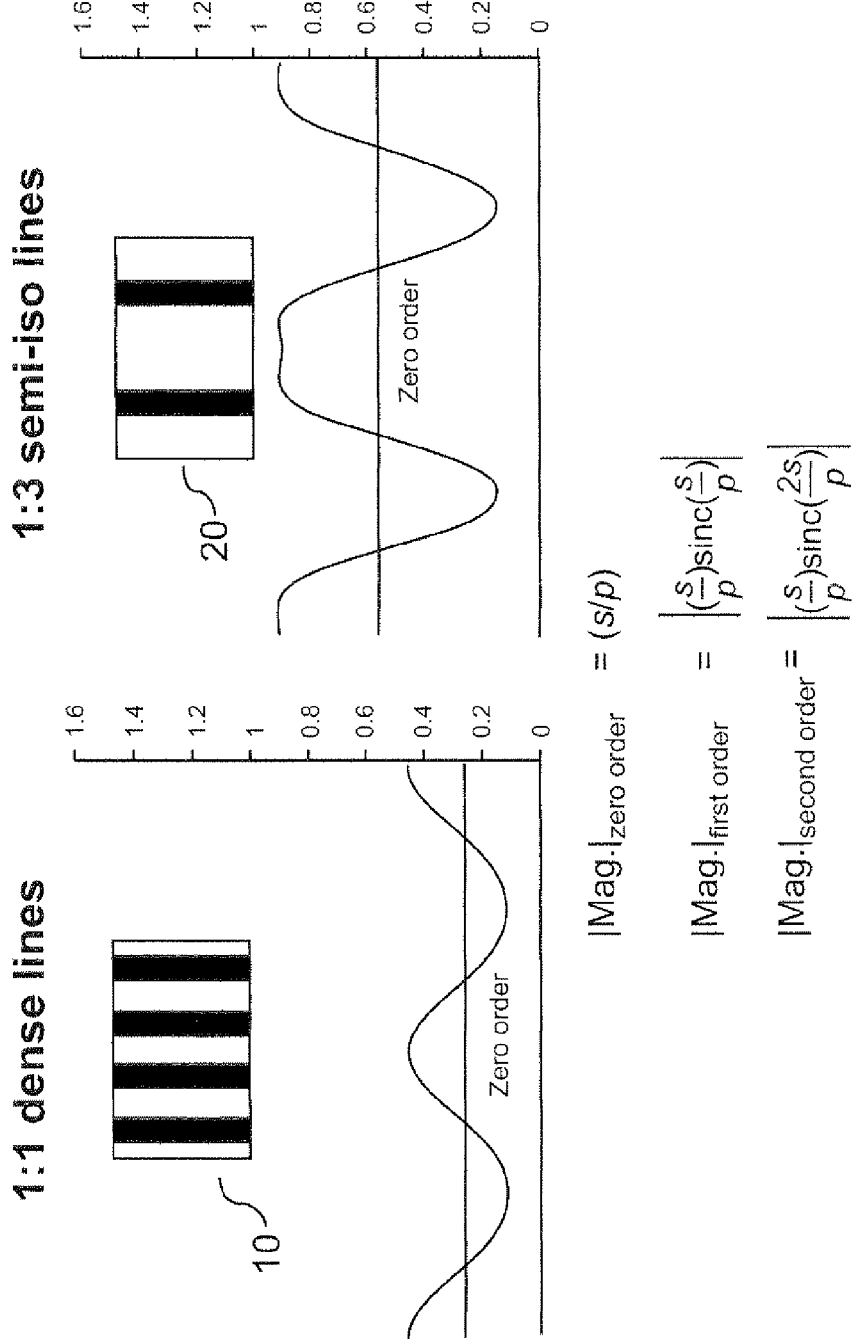

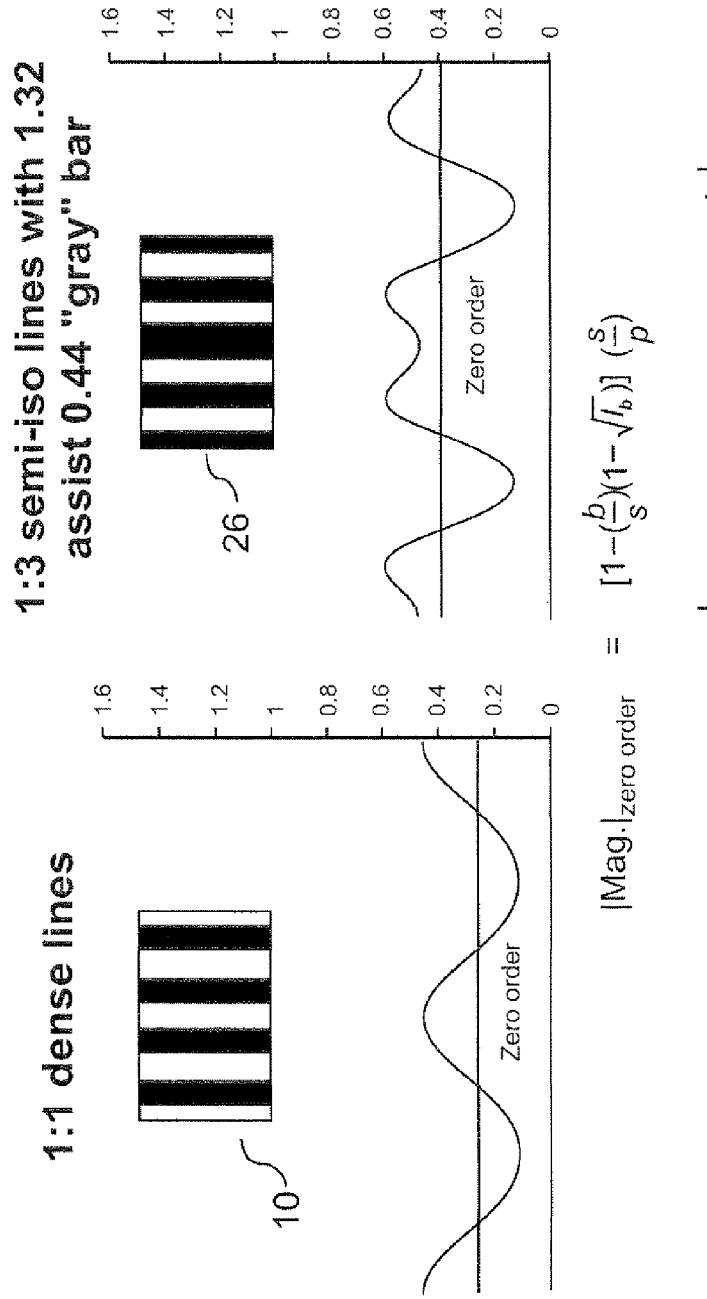

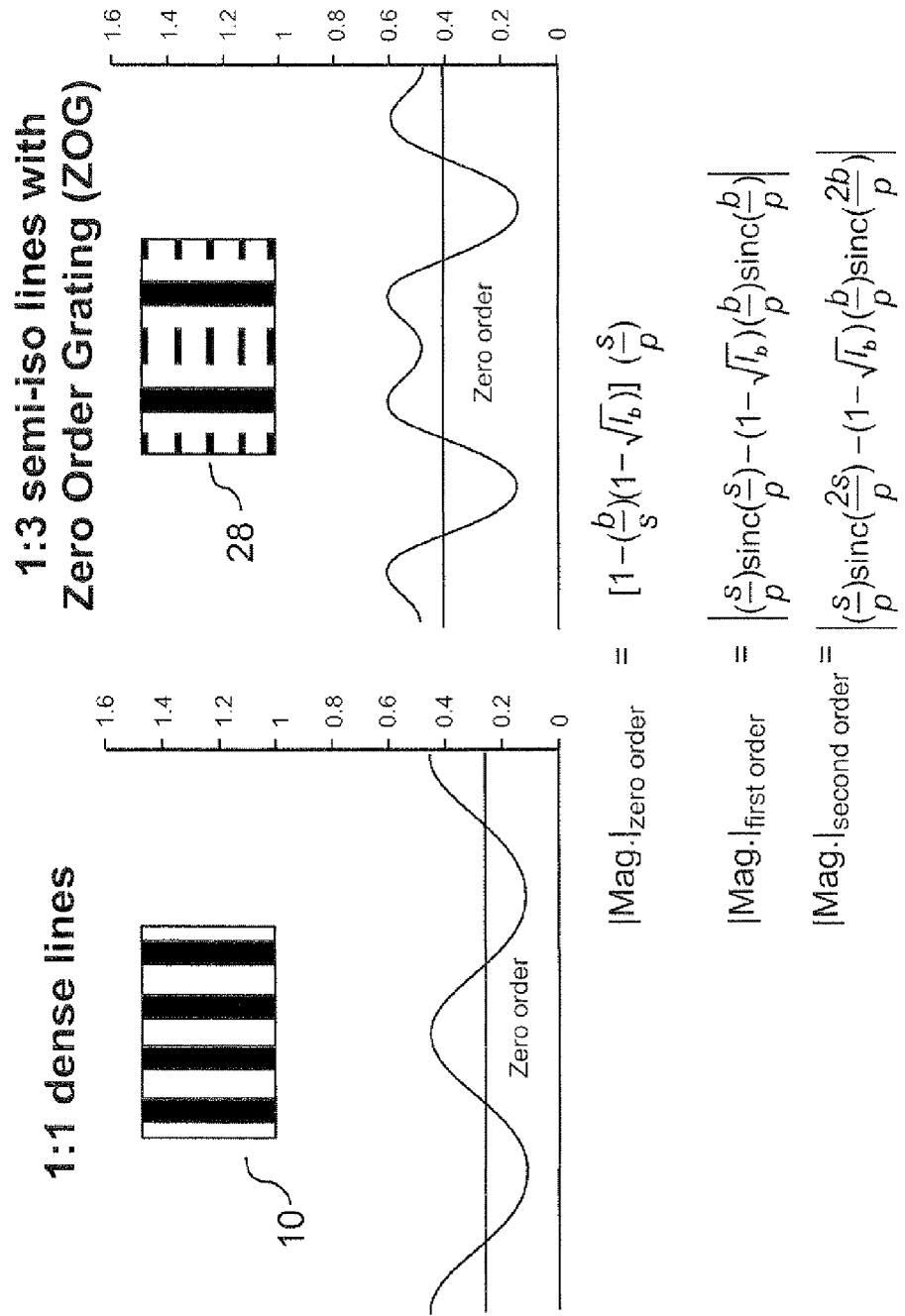

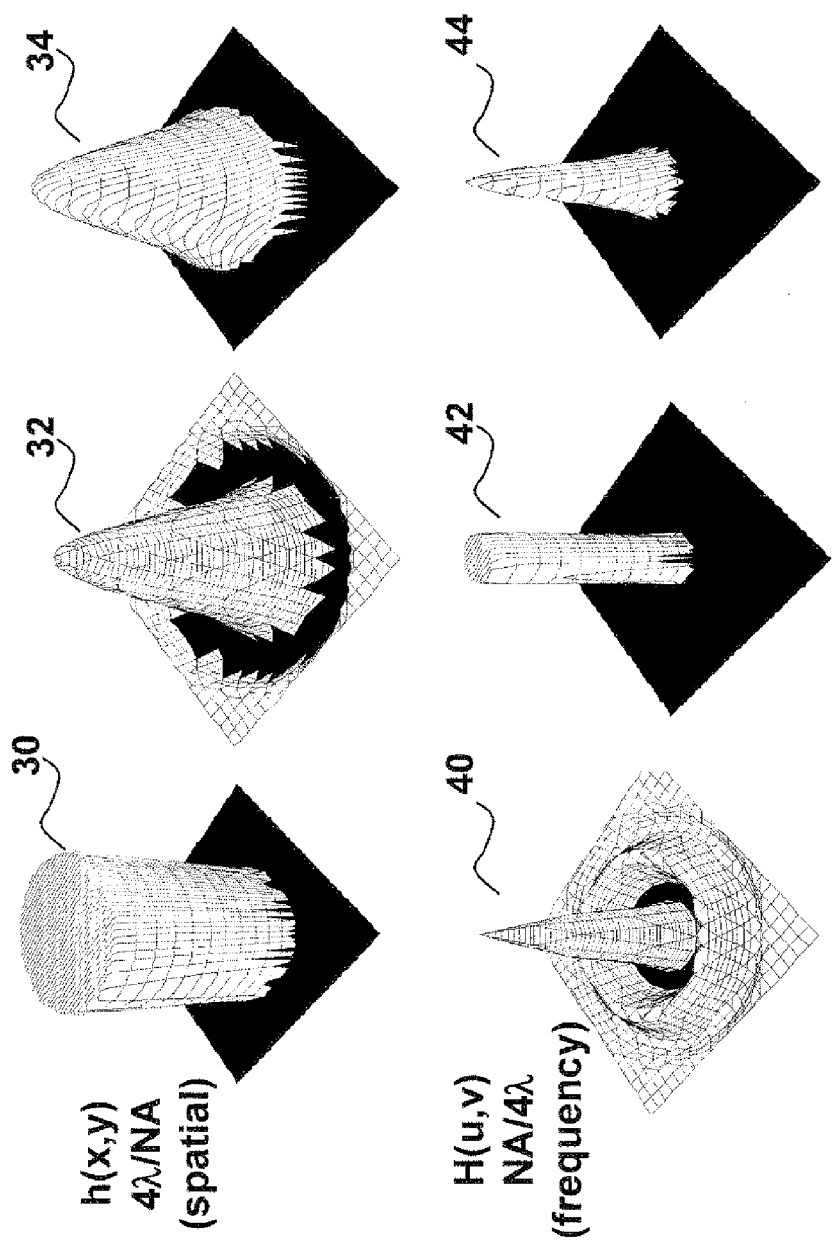

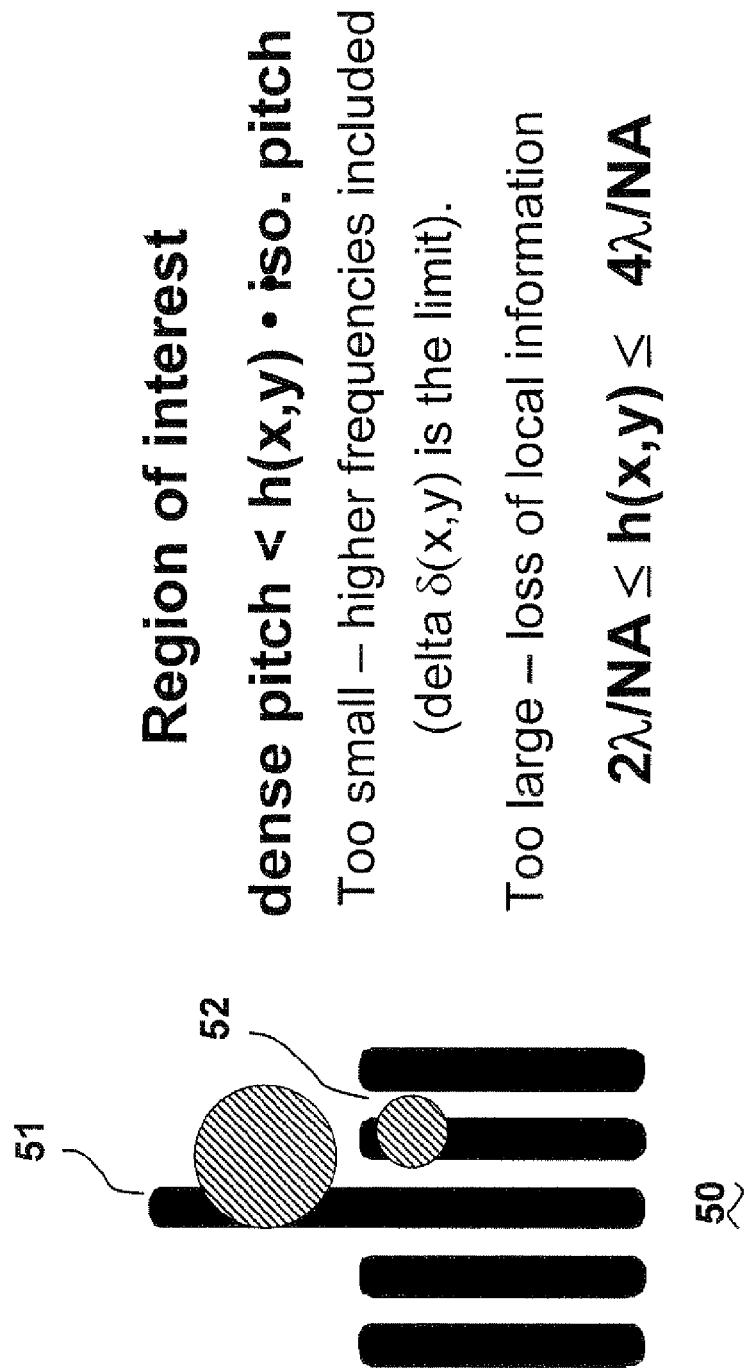

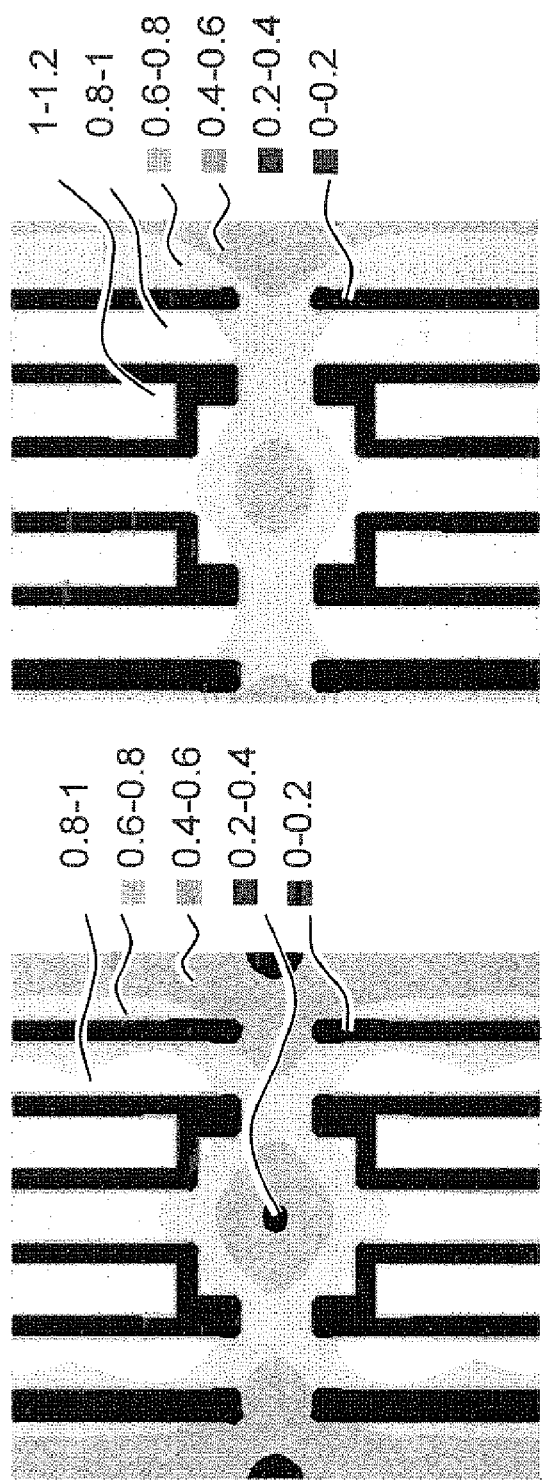

Equalized Threshold

- 0.55-0.65
- 0.45-0.55
- 0.35-0.45
- 0.25-0.35

108

Binary Equalized Mask

107

Original

Corrected

METHOD OF PHOTOMASK CORRECTION AND ITS OPTIMIZATION USING LOCALIZED FREQUENCY ANALYSIS

CROSS-REFERENCE TO RELATED APPLICATIONS

This patent claims the benefit of the filing dates of Provisional patent applications Ser. Nos. 60/349,451 filed Jan. 18, 2002; 60/421,686 filed Oct. 28, 2002, and 60/382,400 filed May 21, 2002.

FIELD OF INVENTION

The present invention relates to the field of integrated circuit photolithography, particularly to mask correction methods used to improve imaging performance.

BACKGROUND OF THE INVENTION

Optical proximity effect reduction methods using sub-resolution assist features have been in use for several years. Reduction methods are referred to as Optical Proximity Correction (OPC) and specific approaches include the use of scatter bars. See for instance J. F. Chen, U.S. Pat. No. 5,242,770 and sub-resolution assist features (SRAFs) as in S. Mansfield, L. Liebmann, A. Molless, and A. Wong, "Lithographic Comparison of Assist Feature Design Strategies," Proc. SPIE 4000, pp. 63–76, 2000. Assist feature OPC has been shown to improve across pitch imaging performance of low $k_1$ features where $k_1$=pNA/2? and p equals pitch, NA equals the numerical aperture of the objective lens, and ? equals the exposure wavelength. Assist feature OPC has been described using various treatments but it can be most useful to consider the diffraction field effects introduced. Description and analysis has been carried out for a variety of resolution enhancement technique (RET) combinations with assist feature OPC, such as B. W. Smith, "Mutual Optimization of Resolution Enhancement Techniques", J. of Microlithography, Microfabrication, and Microsystems, 2, 2002, and B. W. Smith, "Mutual Optimization of Resolution Enhancement Techniques", J. of Microlithography, Microfabrication, and Microsystems, 2, 2002. For multiple assist features, bars are evenly spaced within a space opening between main features. Bars are sub-resolution and the bar frequency is generally beyond the diffraction limits of the imaging system. Because of this, no first order diffraction energy is collected from the bars making the bar frequency inconsequential. As an example, consider an imaging situation for 150 nm main features with a 1:5 duty ratio using 248 nm wavelength and a 0.70 NA objective lens. A typical bar size may be 60 nm and three evenly spaced bars can be inserted between features with a bar pitch of 187.5 nm. The resulting $k_1$ for the bars is 0.27, effectively eliminating lens capture of first diffraction orders using σ values of 0.95 and below. With only zero diffraction order collection, the entire space between the main features experiences a reduction in intensity as a function of the bar width (b) and bar pitch ($p_b$):

$$\text{Space intensity reduction} = \left(\frac{p_b - b}{p_b}\right)^2 = (0.68)^2 = 0.46 \tag{1}$$

The result is exactly that which would be expected if the space transmission was equivalently reduced. It has been suggested that the effect of the adding multiple assist bars corresponds to the introduction of frequency terms to isolated features so as to resemble that of the dense features. This analysis is problematic on two accounts. First, as shown above, the frequency of the bars is often beyond imaging limits, eliminating all but their zero diffraction order influence. Second, if the bars are placed at a frequency that matches that of the dense main features, the likelihood that the bars will print increases when using modified illumination. The frequency of the bars would be such that off-axis distribution of diffraction energy will increase the modulation and the depth of focus of the bars themselves.

Current methods used for OPC layout are based on sets of rules for best pattern performance (known as rules-based OPC) or the extraction of models based on the parameters that result in best pattern performance (known as model-based OPC). With rules-based approaches, adjustments are applied to feature edges, bar sizes, and spacing based on pattern width and edge location. Model-based approaches are based on the convolution of predefined kernel functions with a mask function. See for example J. P. Stirniman, M. L. Rieger, "Fast Proximity Correction with Zone Sampling," Proc. SPIE 2197, pp. 294–376, 1994. Kernel functions may incorporate specific optical, resist, and etch behavior. Both methods are concerned with the spatial (X-Y) fidelity between the structure layout, the mask function, the intensity images, and the images formed in photoresist. It is difficult to optimize lithographic imaging parameters such as OPC strictly from the traditional standpoint of dimensional analysis. Furthermore, it is difficult to perform optimum OPC layout using models or rules based on spatial (or X-Y) information and performance. Such approaches usually lead to sets of rules that are only valid around a small factor sample space. Furthermore, the current approaches do not address the unique nature of a masking layer that consists of a series of contact features or vias.

In order to connect a one level of a device to another, the device must have an array of contacts. Some devices have many contacts and the pattern of a contact mask may have a number of dense features and semi-isolated features. It is desirable to fabricate devices with about the same size contacts. However, often the density of contact features will enlarge contacts in the dense region and contacts in a semi-isolated region will be reduced in size. The disparities in sizes of contact openings or vias is undesired and there is need to correct this problem and provide a lithographic technique that will provide local correction of contact mask to provide uniform contact features.

At present, the rule based systems and model based systems and combinations of the two are complex and often interfere with one another. In other words, corrections made by the rule based systems may offset corrections provided by the model based system.

SUMMARY

The invention provides a method for photomask assist feature OPC layout using a frequency model-based approach. Through low-pass spatial frequency filtering of a mask function, the local influence of zero diffraction energy can be determined. By determining isofocal intensity threshold requirements of an imaging process, a photomask equalizing function can be designed. This provides the basis for frequency model-based assist feature layout. By choosing proximity assist feature parameters that meet the requirements of the equalizing function, through-pitch focus and dose matching is possible for large two dimensional mask fields. The concepts introduced also lead to additional assist feature options and design flexibility.

DRAWINGS

FIGS. 1a–1d compare dense (1:1) to semi-isolated lines (1:3) where various OPC assist structures are inserted between the semi-isolated features.

FIG. 2 shows examples low pass kernels for separating DC signals.

FIG. 3 shows semi-isolated feature proximate dense features.

FIG. 4 shows frequency filters that correspond to the kernels of FIG. 2

FIG. 24 shows intensity value with one resist threshold.

FIG. 25 shows intensity value with another resist threshold.

DESCRIPTION OF THE INVENTION

Assist Feature OPC Layout

Several approaches have been developed for OPC layout. Hybrid methods using sequential application of traditional rules-based and model-based have been employed to reduce the complexity of model-based algorithms alone. This is a consequence of operation in the spatial domain. If the complexity of model-based approaches can be reduced in the frequency domain, such methods would be preferred. Though spatial frequency analysis does not necessarily lead to reduced complexity, it could do so if a limited amount of frequency detail were needed for such a model-based approach. Since the main consequence of assist feature OPC is the reduction zero of order frequency, analysis may be inherently simplified. When we consider the frequency content of low $k_1$ images and the impact of OPC, it becomes evident that this is indeed the situation.[3]

First Embodiment

Low Frequency Impact on Dense and Semi-Isolated Features

Figure 1B:
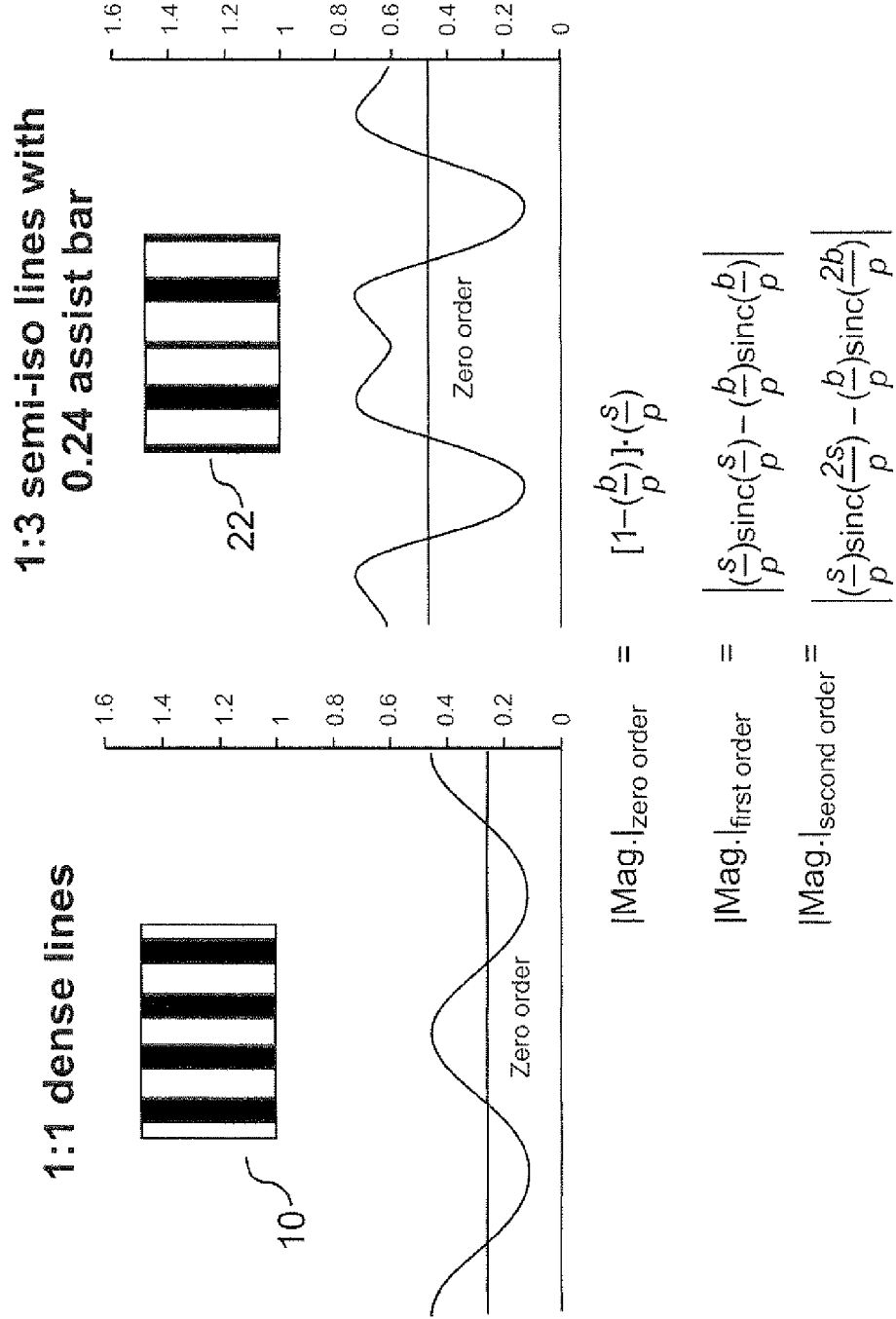
Figure 1C:
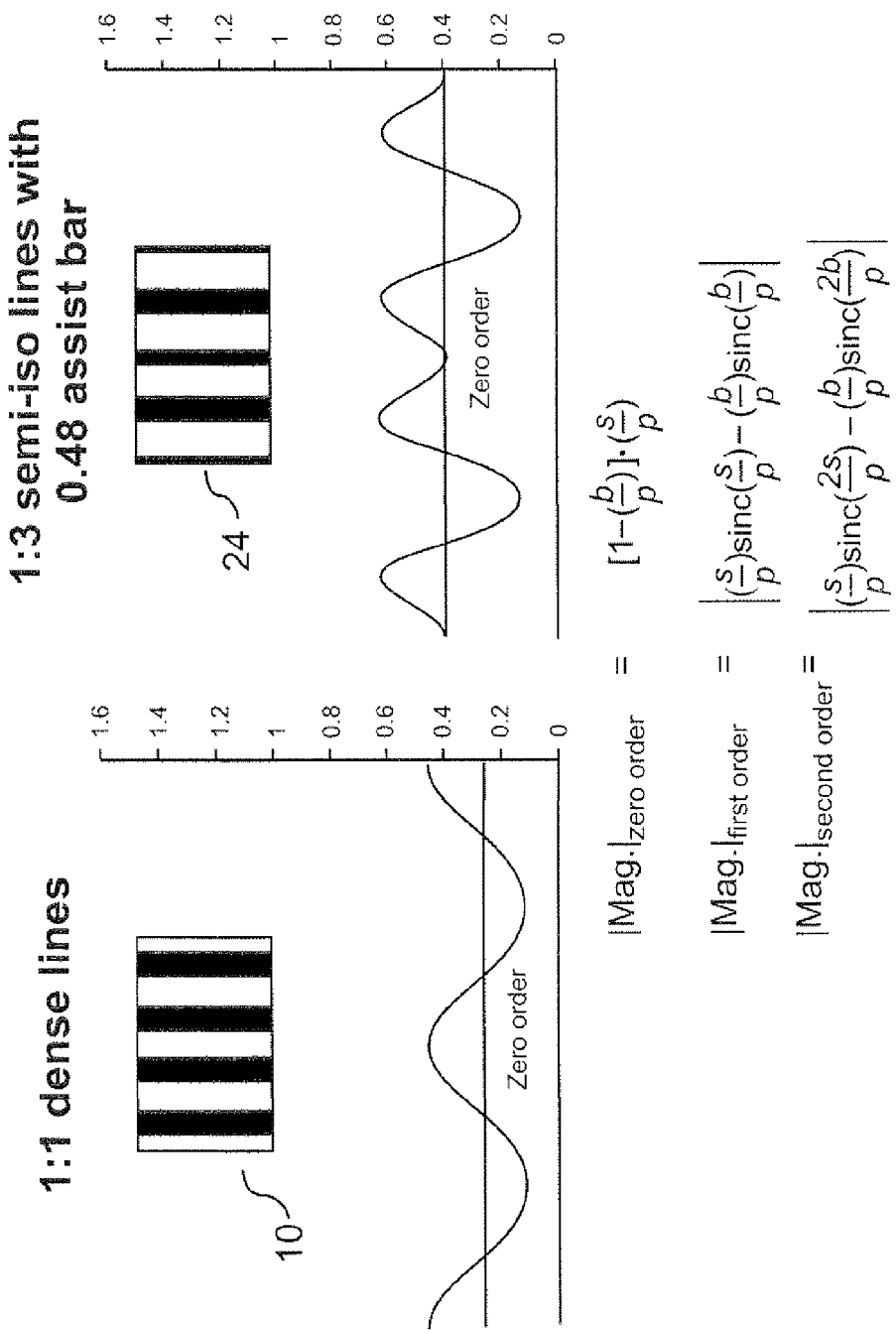

FIG. 1 is used to demonstrate the impact of the zero diffraction order on dense and semi-isolated images. Dense lines 10 (1:1) and semi-isolated lines 20 (1:3) are shown; where various OPC assist structures are inserted between the semi-isolated features. In each case, aerial images are plotted for incoherent illumination over a distance equivalent to twice the pitch. The value of the zero diffraction order bias is shown for each condition. Primary diffraction order magnitude (zero, first, and second orders) contributes to low $k_1$ imaging and can be calculated from the following equations:

$$|Mag.|_{zero\ order} = \left[1 - \left(\frac{b}{s}\right)(1 - \sqrt{I_b})\right] \cdot \left(\frac{s}{p}\right) \quad (2)$$

$$|Mag.|_{first\ order} = \left|\left(\frac{s}{p}\right)\text{sinc}\left(\frac{s}{p}\right) - (1 - \sqrt{I_b})\left(\frac{b}{p}\right)\text{sinc}\left(\frac{b}{p}\right)\right| \quad (3)$$

$$|Mag.|_{second\ order} = \left|\left(\frac{s}{p}\right)\text{sinc}\left(\frac{2s}{p}\right) - (1 - \sqrt{I_b})\left(\frac{b}{p}\right)\text{sinc}\left(\frac{2b}{p}\right)\right| \quad (4)$$

where b is the assist bar size, s is the space width, p is pitch, and $I_b$ is the bar intensity. FIG. 1 gives insight into the problems associated with determining a common process window over a variety of duty ratios. The zero diffraction order is primarily responsible for the isofocal intensity value for a given mask pitch. As the duty ratio is increased, the zero order (or DC signal) increases, leading to larger isofocal intensity. Compare the zero order level of about 0.45 for the 1:1 lines in FIG. 1a to the zero order level of about 0.9 for the semi-isolated lines with a pitch of 1:3. As shown in the FIGS. 1b–1c, the zero order level for the semi-isolated lines 20 (1:3) is greater than the dense lines 10 (1:1). A resist process operates around a small range of intensity to achieve a best depth of focus for dense features. For semi-isolated features, the process has to be changed because the intensity for their best depth of focus is larger than the intensities for the dense features. I found that inserting of assist features leads to a decrease in the zero order, and the intensity of semi-isolated features can be matched closely to the behaviour of the dense geometry. An increase in the second order energy also results, which is a consequence of the placement of the bar mid-way between main features (producing a frequency harmonic). As the bar width increases, the zero order is further reduced but second order increases sufficiently so that the bar may begin to print. By reducing the transmission of the bar (making it a gray bar, FIG. 1d), a larger bar width is tolerable, while limiting its printability through more moderate increases in second order. See FIGS. 1b and 1c where the bar width increases from 0.24 in mask 22, to 0.48 in mask 24. See also gray bar mask 26 with a 0.44 gray bar and FIG. 1d with horizontal bars in mask 28.

Separation of Low Frequency (DC Signal) Through Convolution

The impact of assist feature OPC on the local mask DC signal leads to the improvements in process latitude and common process overlap demonstrated by their use. The convolution methods used in traditional model-base OPC attempt to describe a large array of imaging effects. The convolution kernel for assist feature OPC is not concerned with high frequency detail but instead the lowest frequency information on a local scale. Low frequency kernels 30, 32, 34 of the form shown in FIG. 2 are utilized for the separation of local DC signal. Rather than performing a convolution or sampling operation in the spatial domain however, the mask function in the frequency domain is operated on with a filter function that is represented by the transformation of the spatial (dimensional) information into spatial frequency information. See frequency transforms 40, 42 and 44 of FIG. 4 that correspond to the spatial kernels 30, 32, 34, respectively. This is done with transformational operations such as the Fourier Transform, Cosine Transform, or Wavelet Transform. Alternatively, the operations can be carried out using the frequency domain of prior art lithography simulation tools such as Prolith version 7.0 lithography simulation software available from KLA/Tencor. This software enables a user to simulate predicted process results. It can vary the predicted effect of any process or tool variable on lithographic behavior, including depth of focus optimization. It allows accurate chemically amplified resist calculations and calibrates model parameters to predict process interactions and estimates of manufacturing.

Localized low frequency kernels are defined using lithography requirements, where sizing should discriminate between dense and isolated geometry. FIG. 3 describes the method for choosing kernel width values, where the region of interest of the function h(x,y) should fall between dense pitch and isolated pitch values. It is known that sub-resolution features do not image but they can reduce or enhance the intensity of proximate features that are to be imaged. A mask pattern 50 has some bars added proximate the semi-isolated feature 51 to enhance the intensity of its image and other sub-resolution features added at region 52 to reduce the intensity of the image of the dense features. If a limiting dense pitch value of $\lambda/(\sigma+1)NA$ is considered, kernel width values between $2\lambda/NA$ and $4\lambda/NA$ are practical.

Frequency Filtering Using Image Models

Figure 5:
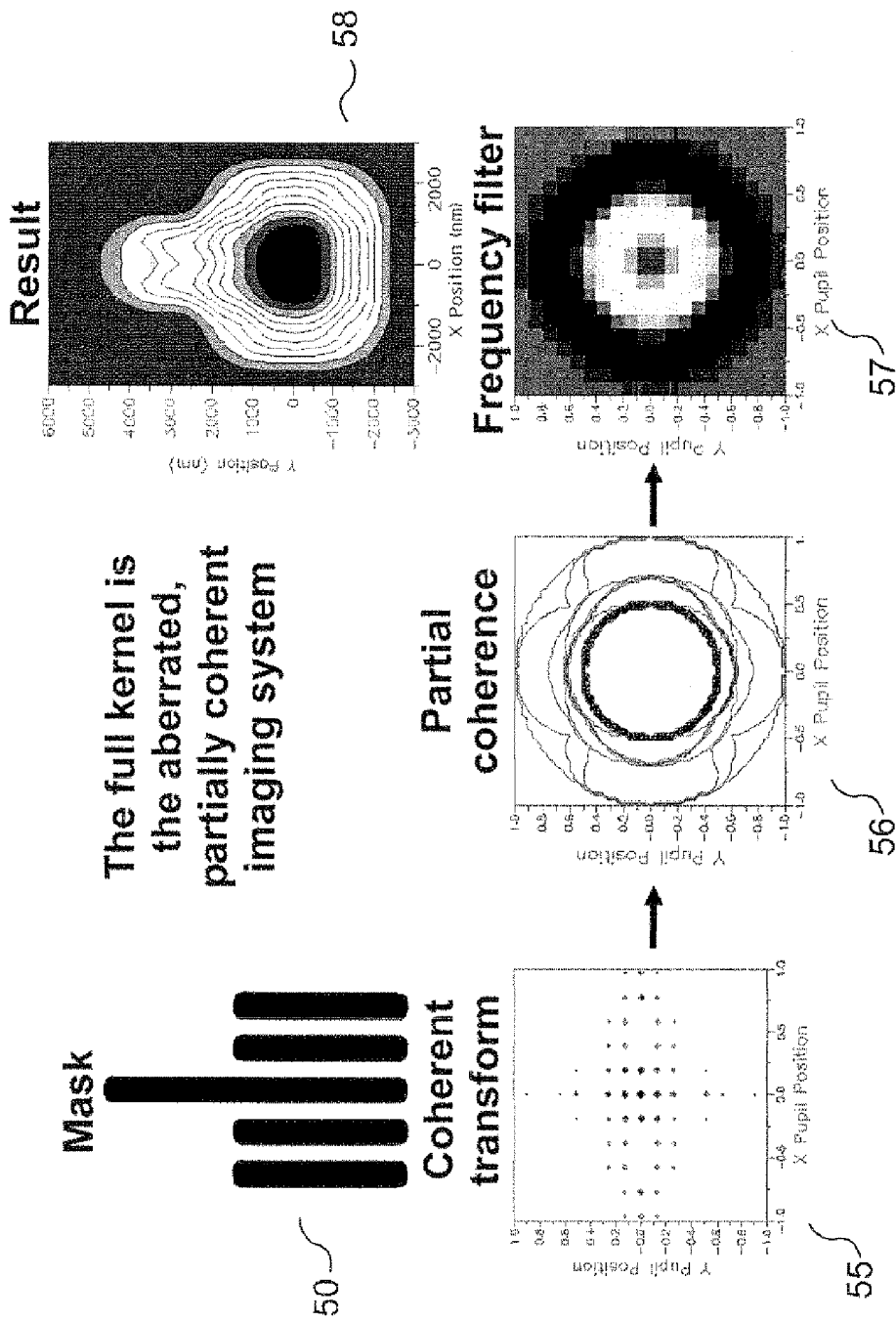
FIG. 5 shows steps in the process of DC filtering.

Low-pass frequency based filters 40, 42, 44 that correspond to the kernels of FIG. 2 are shown in FIG. 4. These examples include circular, Guassian, sinc, and Besinc shaped forms of low pass filters but other low-pass filters can be suited for the operation. These functions are defined in frequency domain with a corresponding width H (u, v) between $NA/2\lambda$ and $NA/4\lambda$. The chosen filter must have a size greater than the spacing between dense features and less than the spacing between semi-isolated features. The advantage of operating on a mask function in the frequency domain is the ability to insert the functions as pupil filters in a scalar or vector lithography image model. If such a frequency filter is inserted into a lithography model as a pupil plane filter, the entire parametric description of a lithography process is possible. The full kernel becomes the aberrated, partially coherent imaging system. The process is depicted in FIG. 5 using a lithography simulation tool. Simulations were carried out using lithography vector image models and lumped parameter models in Prolith version 7.0. A mask function 50 is illuminated with an arbitrary source shape, leading to a coherent transform 55, a partially coherent frequency plane distribution 56, which is filtered through the low frequency pupil function 57 to provide the result image 58. That image 58 is an indication of the local DC signal across the mask field. Note that it is highest in the center at the middle due to the dense features 52. The highest intensity has a slight bulge at the center due to the semi-isolated feature 51.

Application to One-Dimensional Mask Patterns

Figure 6:
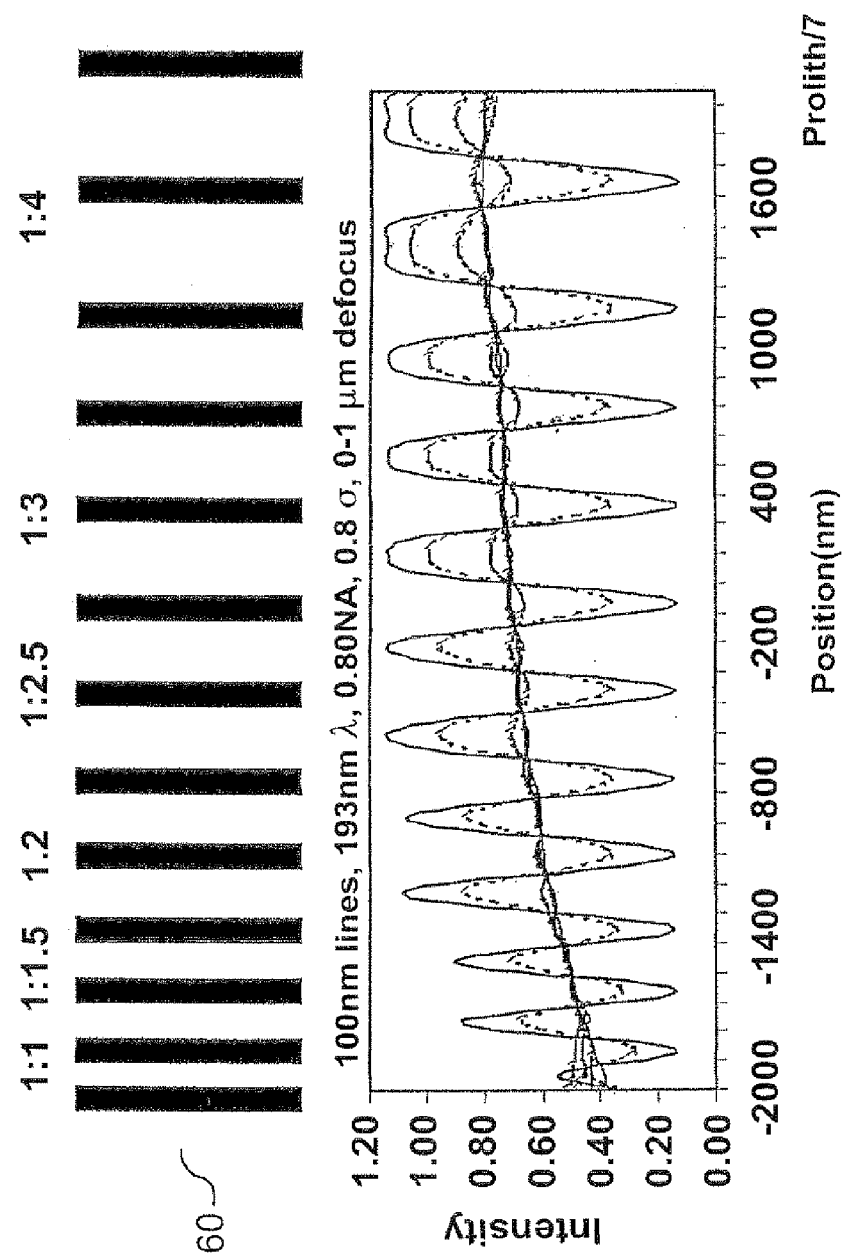
FIG. 6 shows a mask function to demonstrate the analytical method of the invention.

The mask function 60 depicted in FIG. 6 is used to demonstrate the analysis method used to determine assist feature application. In this example, 100 nm lines are considered with duty ratios ranging from 1:1 through 1:4. A wavelength of 193 nm is used with an objective lens NA of 0.8 and a partial coherence value of 0.8. Image intensity for four defocus values from 0 to 1 μm are shown below the mask layout. At 1 μm defocus the isofocal intensity varies through pitch from a value near 0.4 for 1:1 dense features to 0.8 for 1:4 features. This ~2× variation is at the heart of the problems associated with focus and dose matching across a large duty ratio range. If a photoresist is optimized for the dense features, it will not accurately reproduce the semi-isolated features. The goal for assist feature OPC is to produce a better match in the isofocal intensity through this pitch variation.

Figure 7:
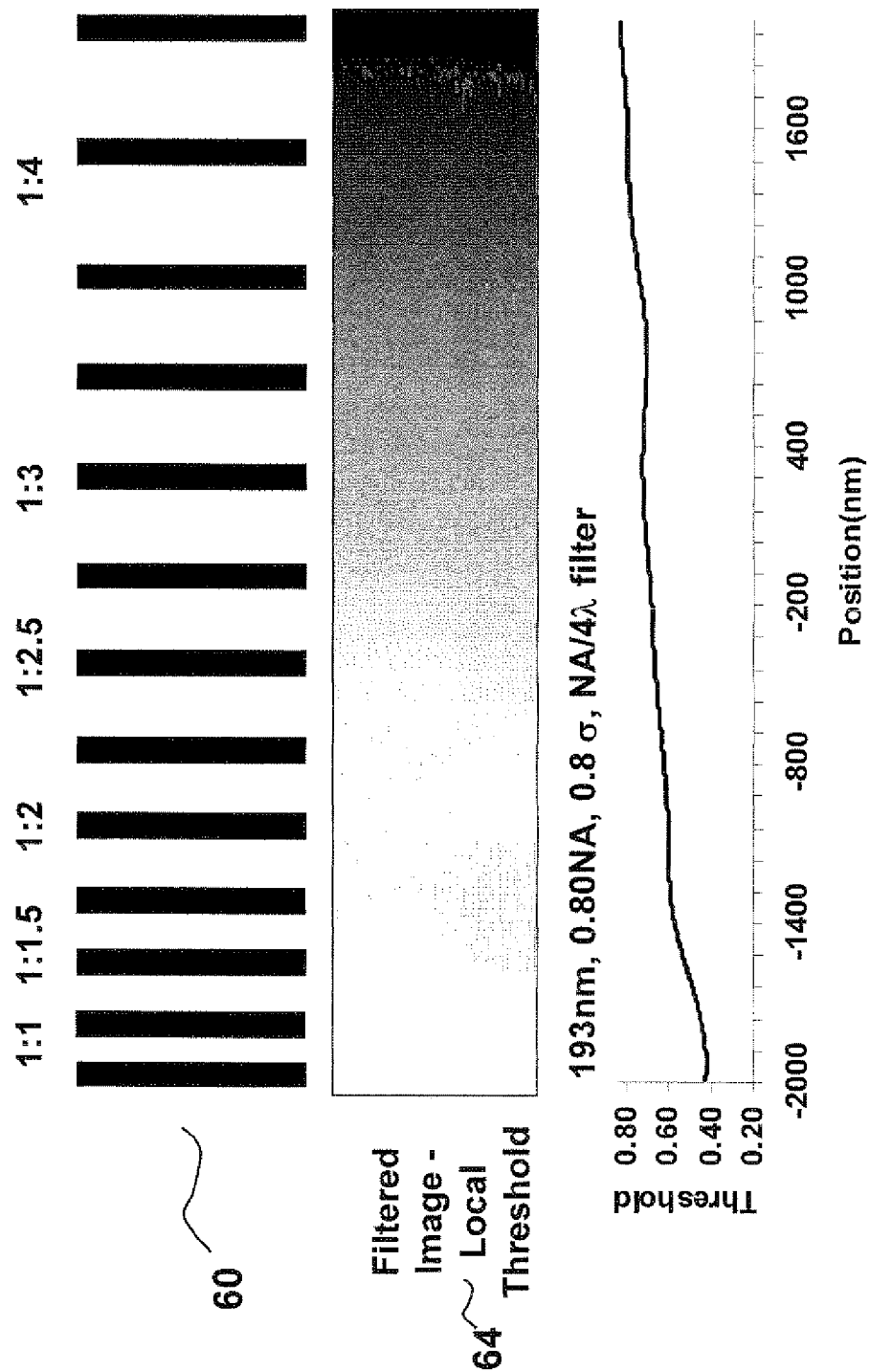
FIG. 7 shows an equalized mask transmission function.
Figure 8:
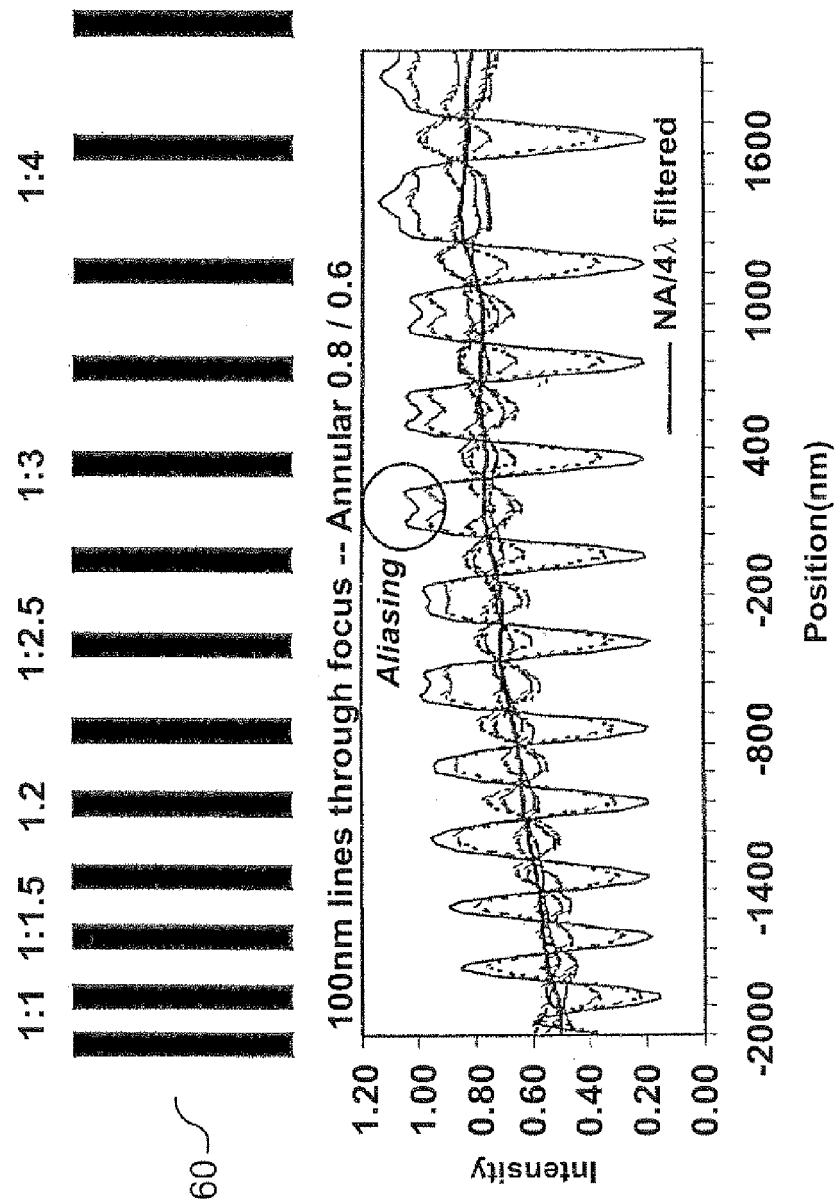
FIG. 8 shows the through-focus behavior of the mask function of FIG. 7 illuminated with an annular source using an outer σ of 0.8 and an inner σ of 0.6.
Figure 9:
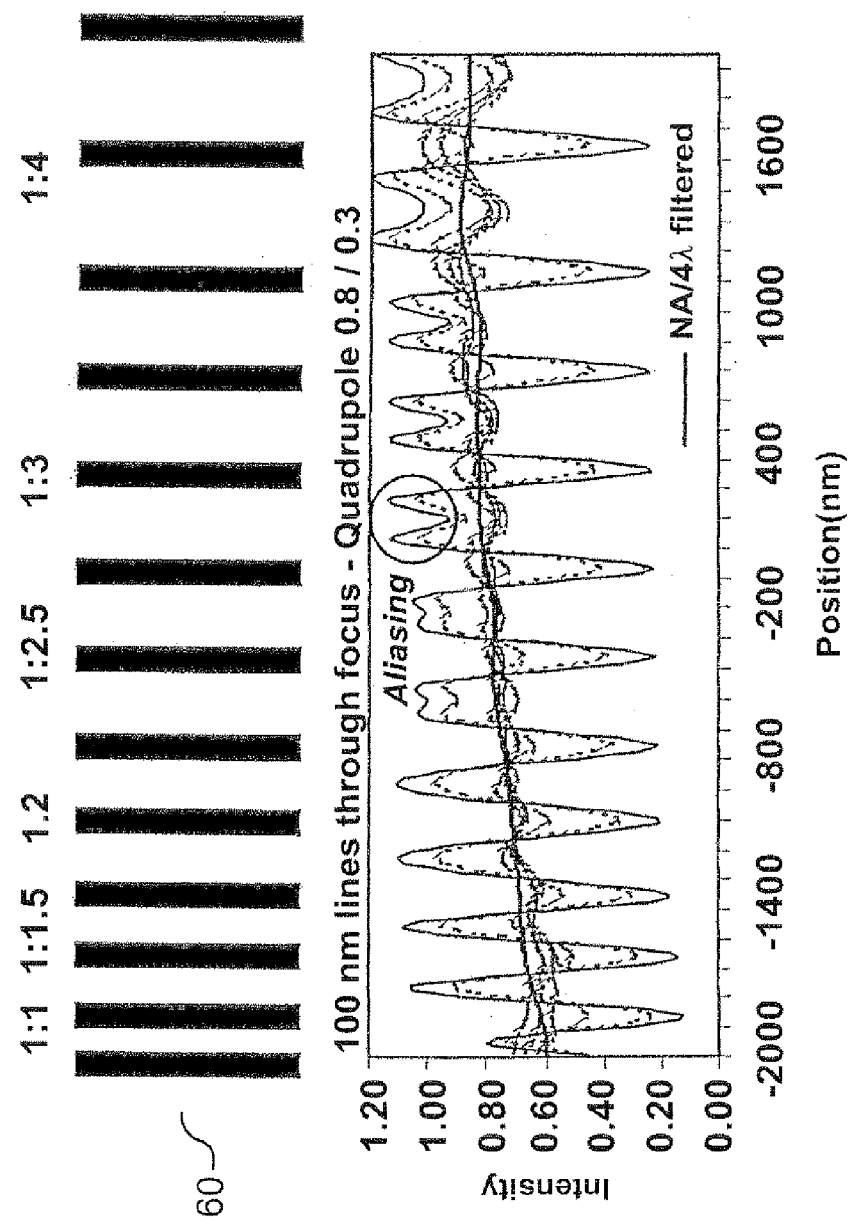
FIG. 9 shows the results using a quadrupole illumination with a center σ of 0.8 and a radius of 0.3. The local DC threshold function is also plotted.

Frequency plane filtering was carried out for the mask function using the method depicted in FIG. 5 with a NA/4λ filtering function. The result is a local DC threshold function 64 that is indicative of the isofocal behavior of the mask through focus. FIG. 7 shows this result, with excellent agreement to the through-focus isofocal behavior of FIG. 6, increasing from a value near 0.4 for 1:1 duty ratio to 0.8 for 1:4. This shows that frequency plane filtering can accurately predict through-focus isofocal behavior. Since this result is calculated using a lithography image model, it is possible to make variations in the imaging situation to arrive at unique solutions for specific image conditions. FIG. 8 shows the through-focus behavior of the mask function imaged as before but illuminated with an annular source using an outer σ of 0.8 and an inner σ of 0.6. The isofocal behavior is shown along with the local DC threshold function, generated through frequency filtering. The solution is unique compared to that for partially coherent illumination. Note also the slight reduction in intensity in the space regions starting at a duty ratio of 1:2.5. This is an aliasing artifact, a result of higher frequency harmonics introduced with oblique illumination. FIG. 9 shows the results using a quadrupole illumination with a center σ of 0.8 and a radius of 0.3. The local DC threshold function is also plotted.

Figure 10:
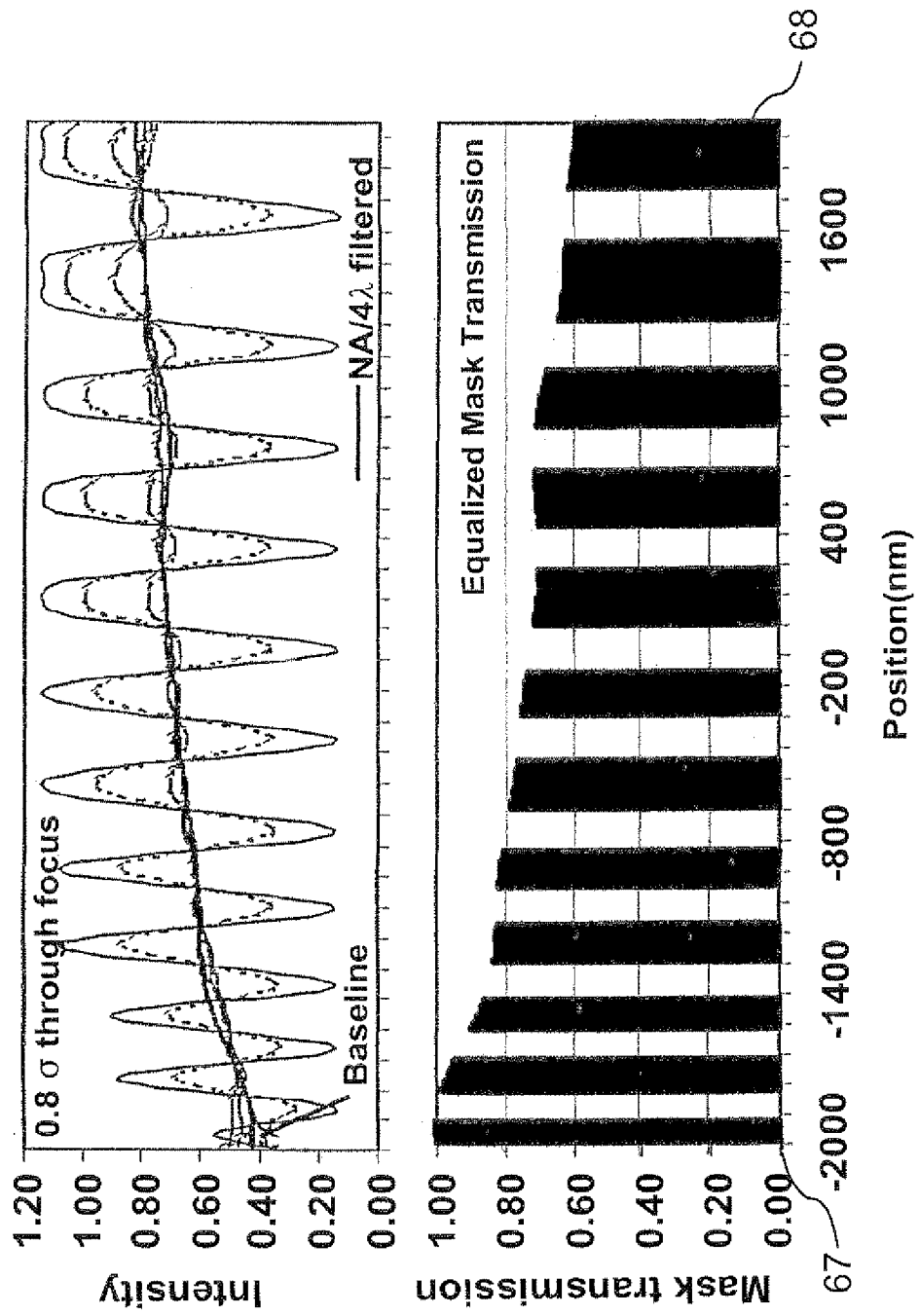
FIG. 10 is an equalized mask transmission function corresponding to FIG. 7.
Figure 11:
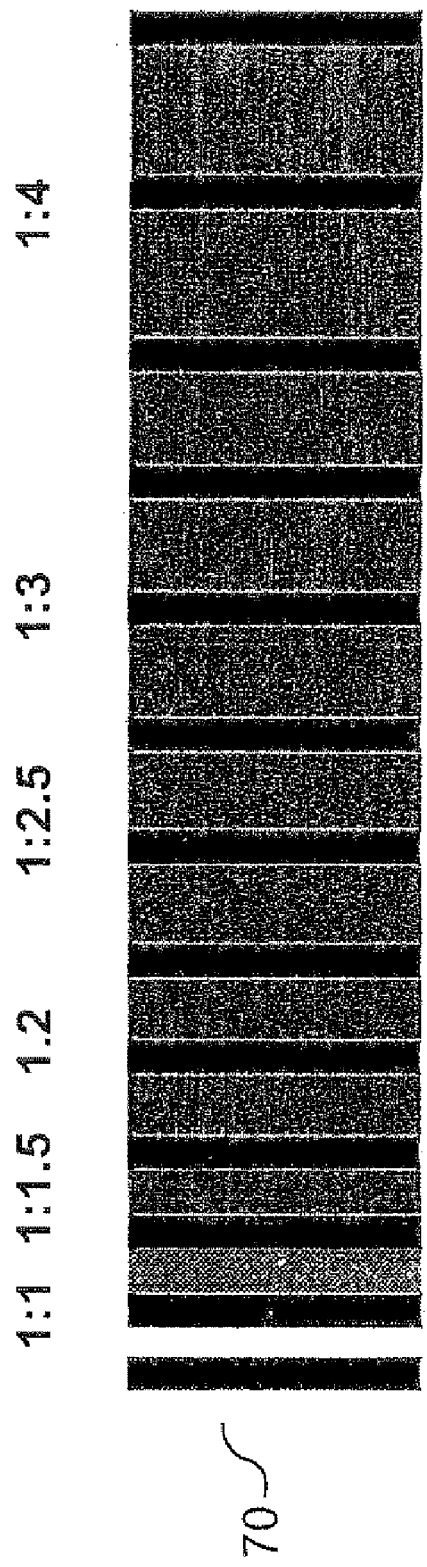
FIG. 11 is a gray level threshold leveling mask corresponding to FIG. 10.
Figure 12:
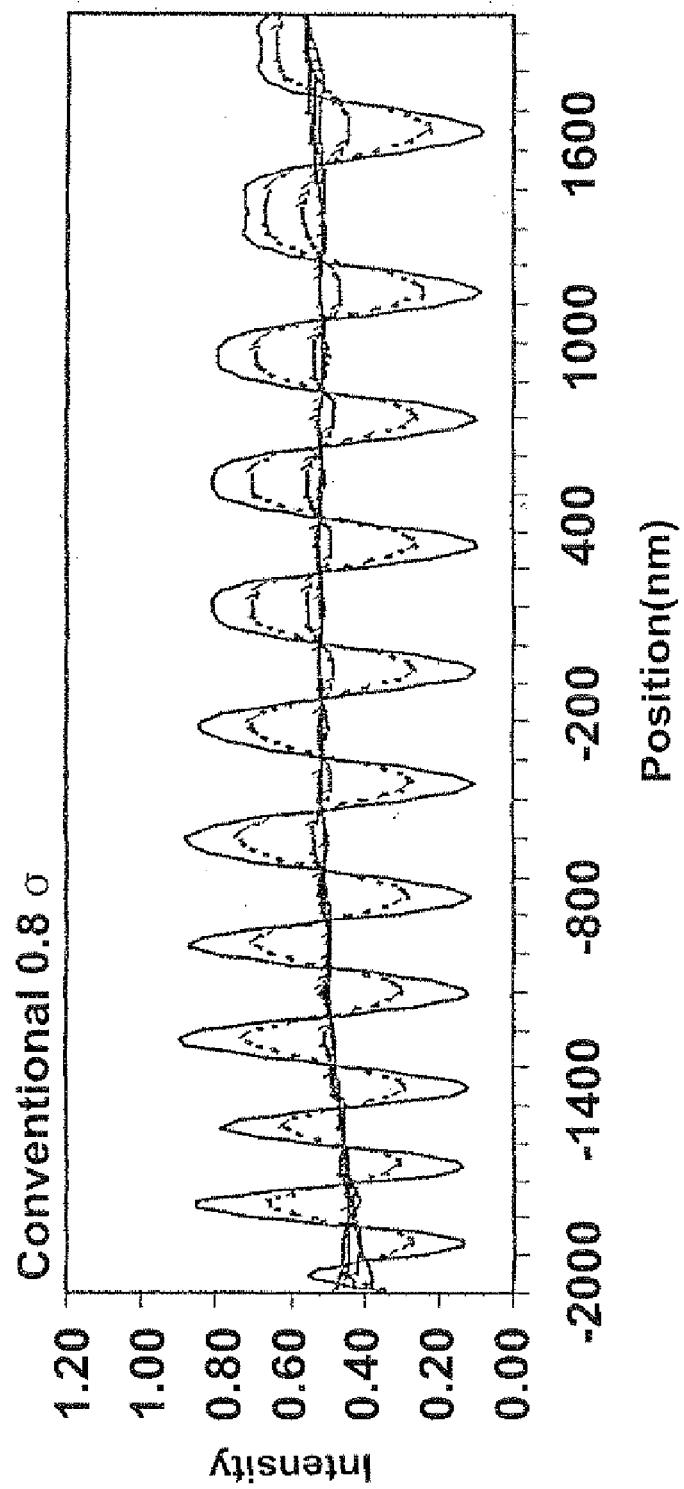
FIG. 12 shows imaging results of the gray level mask of FIG. 11.
Figure 13:
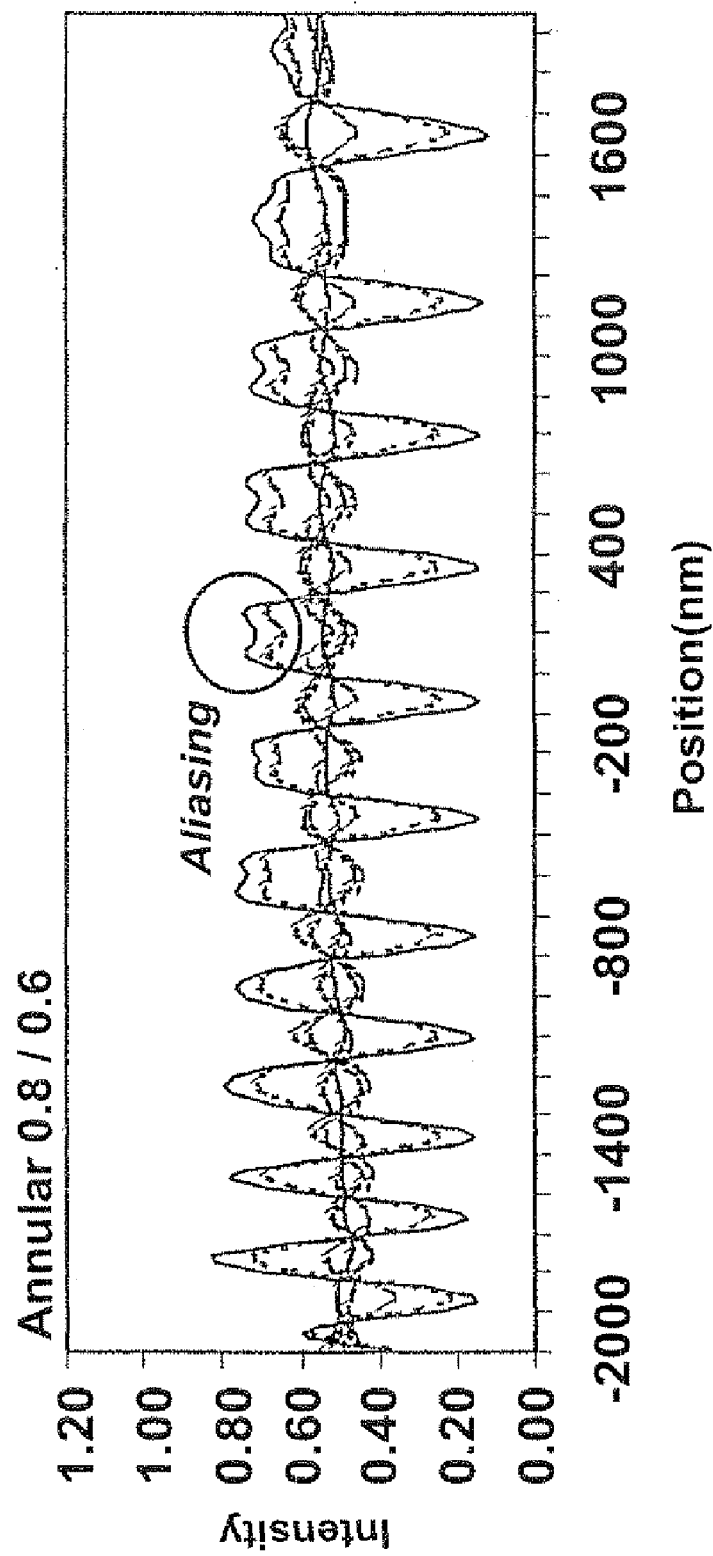
FIG. 13 shows results for annular illumination.
Figure 14:
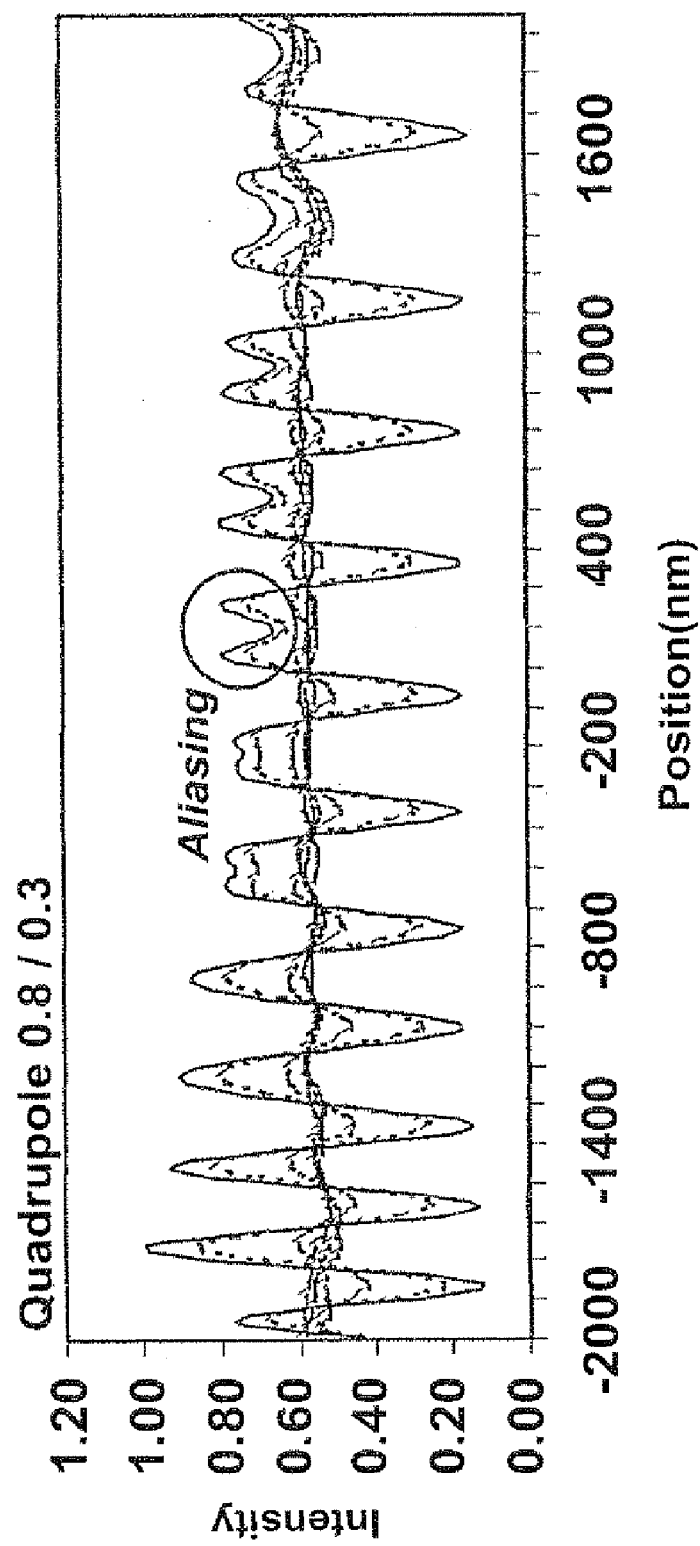
FIG. 14 shows results for quadrupole illumination.

The result from low frequency filtering can be used to generate mask corrections to equalize the isofocal behavior across the mask. An equalized mask transmission function is generated from the reciprocal of the local DC threshold function, normalized to a baseline isofocal intensity or resist threshold value, such as that seen in FIG. 7. The result 67 is shown in FIG. 10, where a baseline intensity of 0.42 was chosen to match all duty values to dense lines. The resulting threshold leveling mask 70 is shown in FIG. 11, where the intensity of the space regions between lines is reduced according to FIG. 10. Imaging results from this gray level mask are shown in FIG. 12 through 1 μm of defocus. The isofocal intensity across pitch is reduced to values between 0.40 and 0.48 by equalizing the dose in the space regions in the mask. FIGS. 13 and 14 show the unique results for annular and quadrupole illumination. The use of a gray level mask would have practical limitations, requiring translation into a binary representation to be compatible with lithographic imaging. This is accomplished through the use of assist features. In effect, the gray level mask is generated by pixilation of original with optical proximity assist features such as vertical bars, ladders or boxes as explained below.

Assist Feature Layout Through Threshold Equalizing

Figure 15:
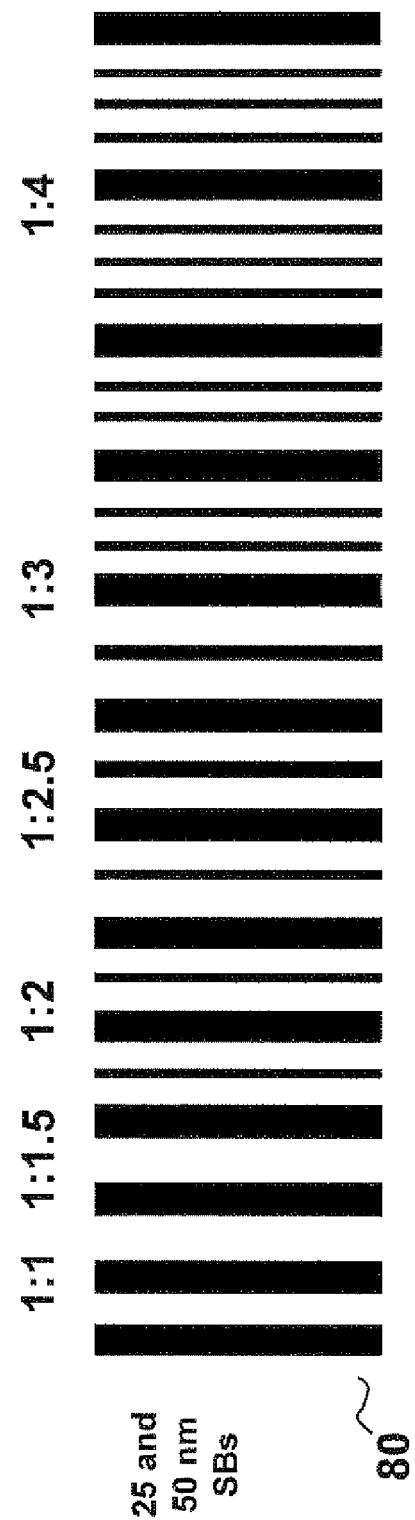
FIG. 15 shows an example with 25 and 50 nm bars.
Figure 16:
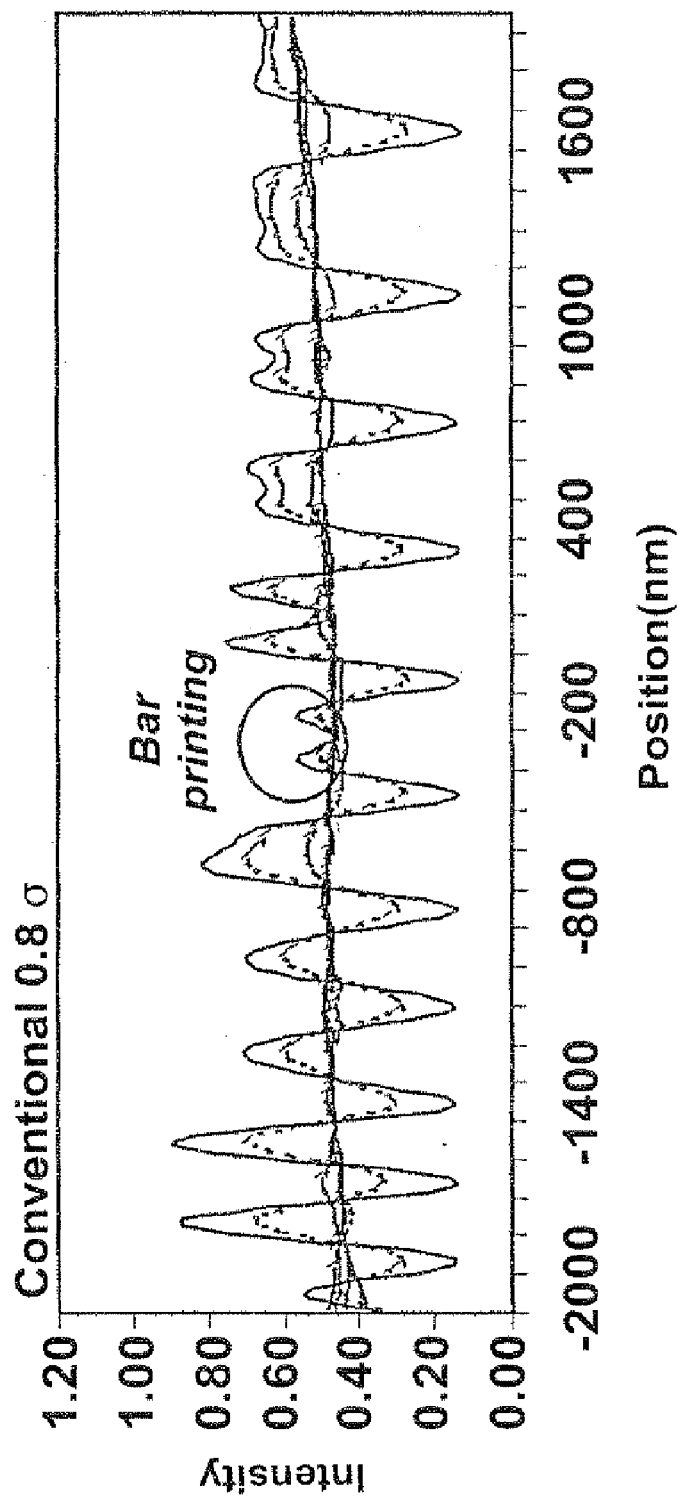
FIG. 16 is a graph of thee equalizations of the bars of FIG. 15 for a partial coherence factor of 0.8
Figure 17:
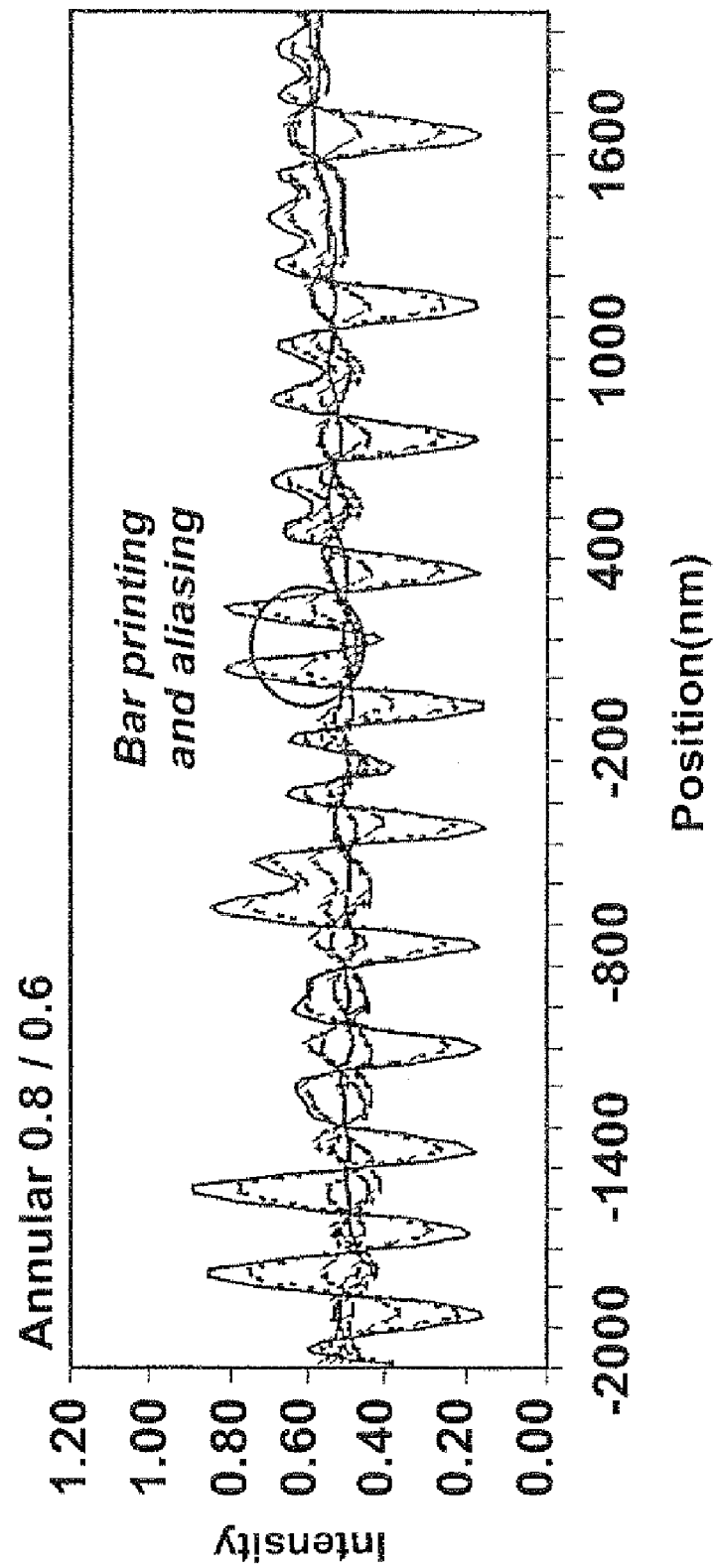
FIG. 17 shows through focus imaging with annular illumination.
Figure 18:
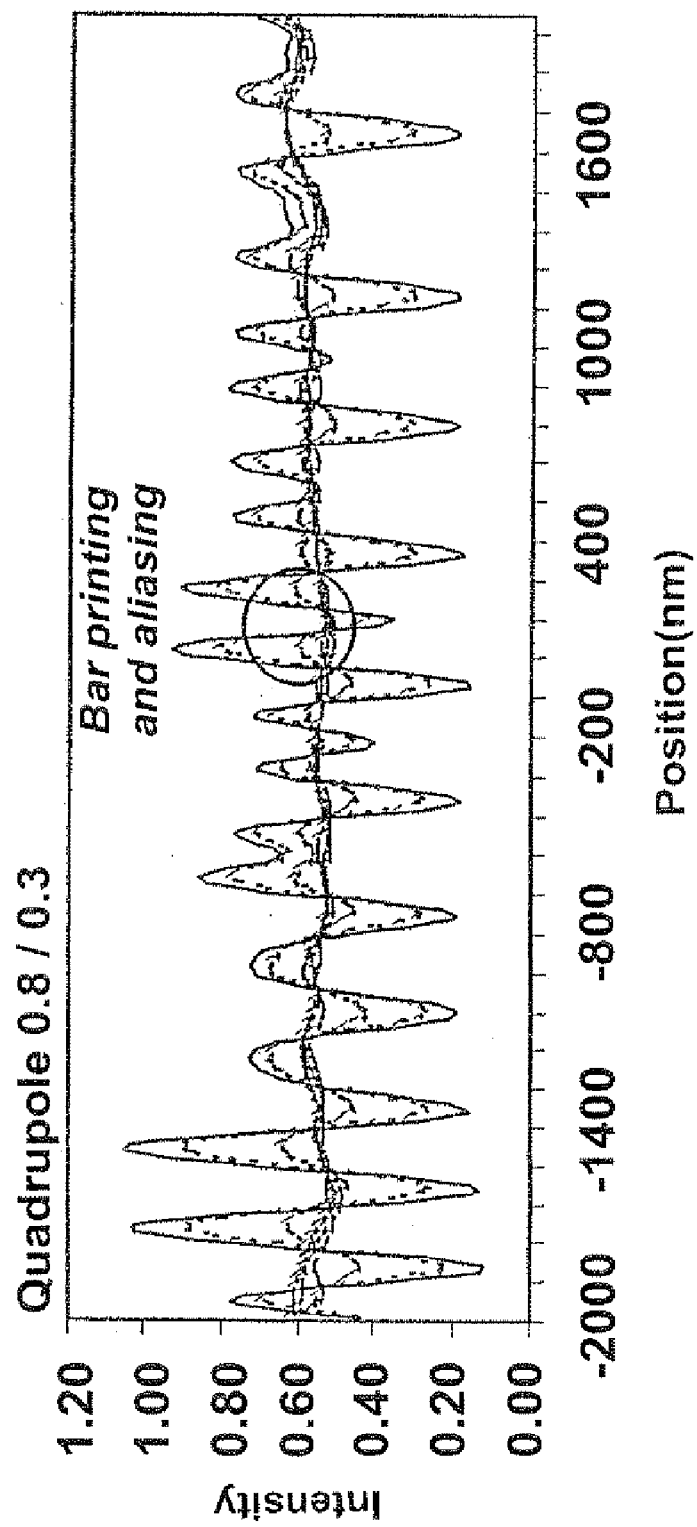
FIG. 18 shows through focus imaging with quadrupole illumination.

The solutions of FIGS. 12–14 are a result of a gray level mask function. The reduction of the intensity within space regions results in an equalization of the isofocal behavior. In other words, each feature is given equal exposure despite it proximity to other features. Equivalent solutions are possible by using sub-resolution assist features, designed so that their width and spacing consumes an equivalent amplitude (and resulting intensity). Rules are developed to define the limits of wavelength, NA, and partial coherence. An example is shown in FIG. 15, where 25 nm and 50 nm bars are employed and equally spaced between main features as solutions to the equalized mask transmission 80, such as that from FIG. 10. The equalization of isofocal intensity using pixilation bars for a partial coherence factor of 0.8 is shown in FIG. 16. For example, the high density duty cycle is passed through at a mask transmission of 1.0 so that there is no reduction. But the semi-isolated features are passed through with reductions that increase with duty cycle. The 1:4 lines are reduced by a factor of 0.6 and 0.6 times the uncorrected intensity of about 0.8 (FIG. 6) results in a corrected intensity of about 0.48. See FIG. 12. There are regions where bar printing becomes evident, especially at the 1:2.5 duty ratio. This is an artifact of the layout and mask constraints. FIGS. 17 and 18 show through focus imaging with annular and quadrupole illumination. Equalization is also achieved through the entire pitch range. Bar printing can be compounded with the high frequency aliasing effects from the oblique illumination used. This effect is problematic and often leads to the avoidance of certain pitch values.

Perpendicular Assist Features

Historically, multiple bars are arranged parallel between main features. The result is that which would be expected if the space transmission was equivalently reduced. Control of the isofocal intensity for certain space values is difficult with the multiple assist bar approach because of the constraints of the bar width and spacing values. An alternative method to achieve the effect of space intensity reduction is to place perpendicular ruled bars (or Ladder Bars, LBs) between main mask features where the bar pitch is beyond the resolution limits of the imaging tool, or below $\lambda/(\sigma+1)NA$. This can allow for finer control of the resulting space intensity reduction and it allows for control of an effective frequency component of the correction bars along the axis of the main feature edges and between the main features. By placing perpendicular bars between the main features, the primary diffraction orders (that is the zero, first, and second orders) are modified according to Equations 2–4. Parameters are defined as before but the bars are oriented orthogonal to the main features. The presence of the perpendicular bars with pitch values below the diffraction limits of the exposure tool provides for the control of the main feature diffraction energy along the feature edges and at the ends.

Figure 19:
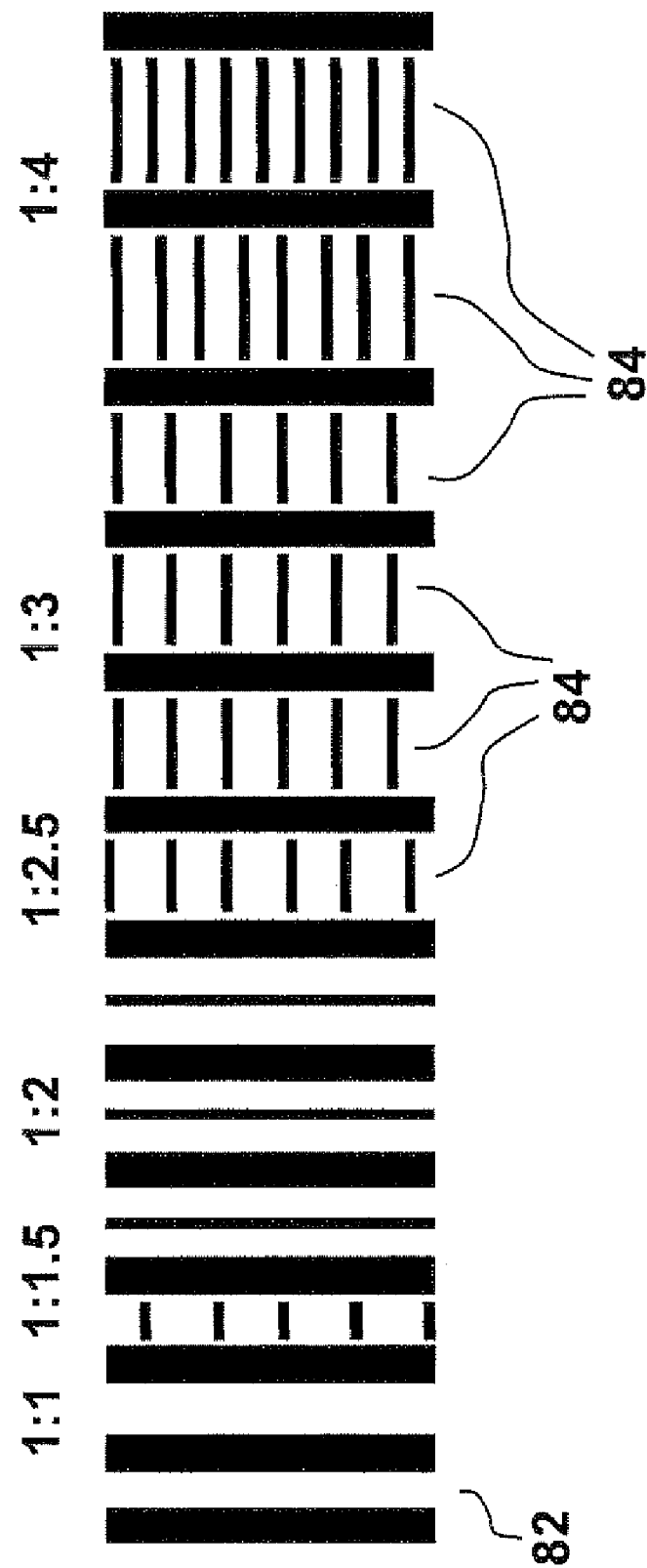
FIG. 19 shows example of perpendicular ladder bars.
Figure 20:
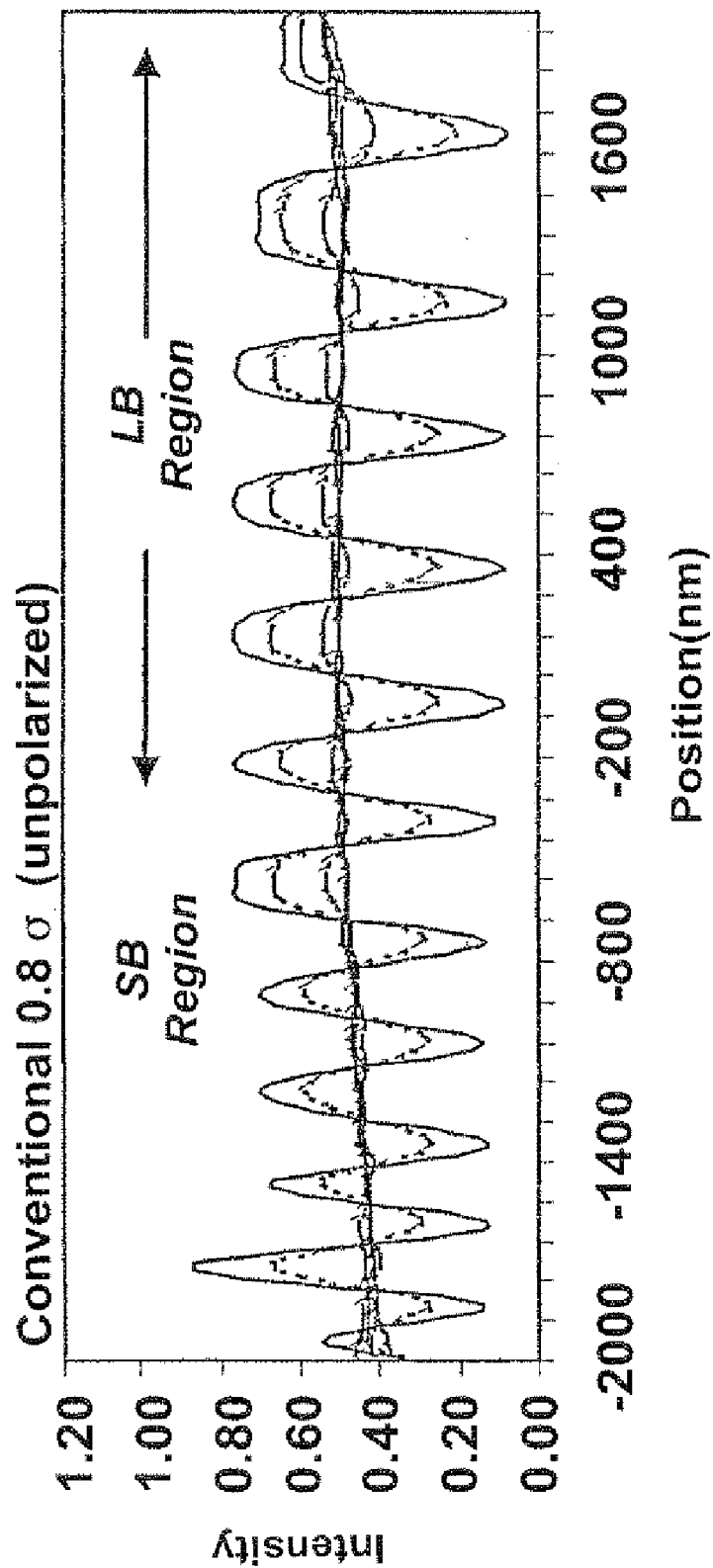
FIG. 20 shows imaging results for partial coherence.
Figure 21:
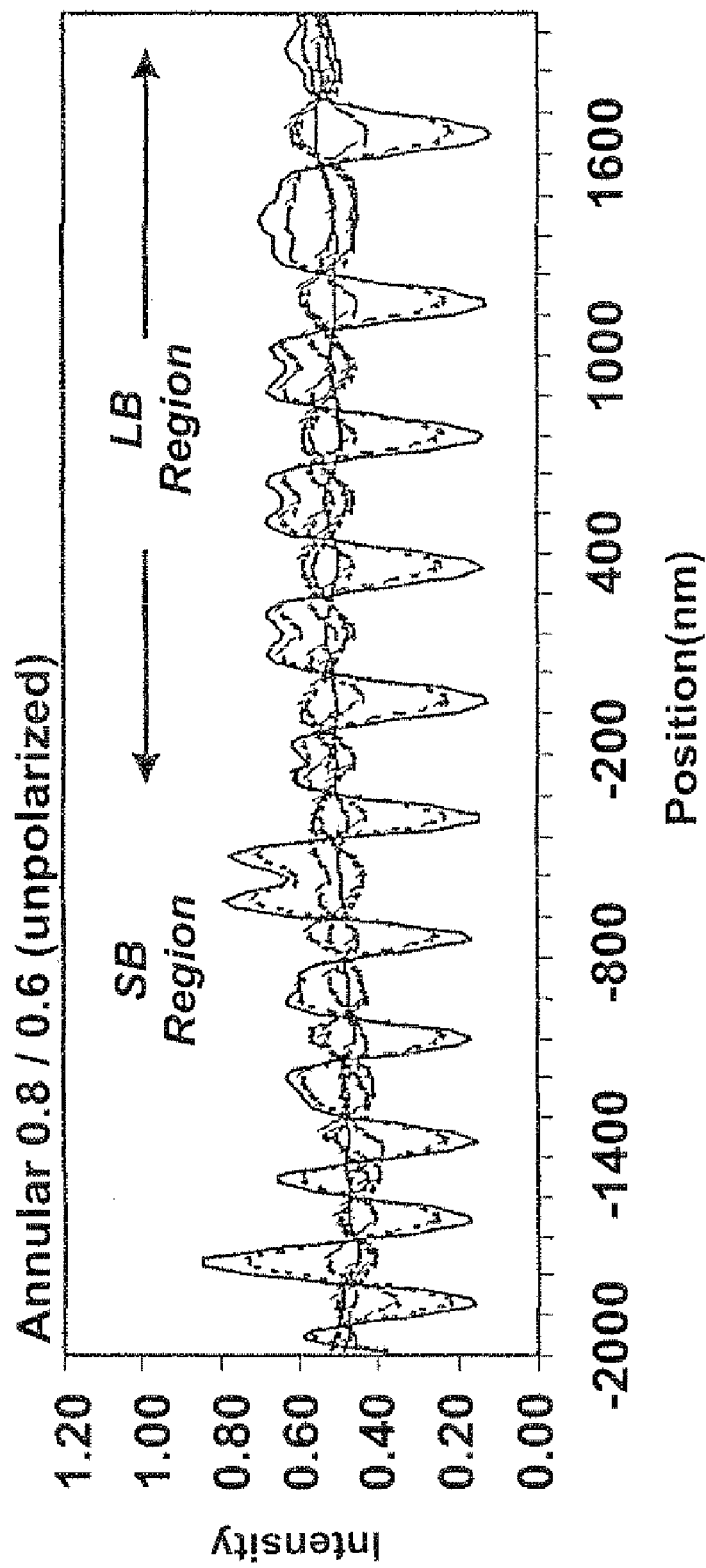
FIG. 21 shows imaging results for annular illumination.

An example of the use of perpendicular bars is shown in FIG. 19. Conventional parallel assist bars are inserted in 1:2 regions of the masks 82. All other regions (excluding 1:1) contain 25 nm Ladder Bars 84 spaced to achieve the required intensity reduction for equalized isofocal performance. The use of this bar orientation increases the design flexibility of assist feature OPC. FIGS. 20 and 21 show imaging results for partial coherence and annular illumination. Note the absence of bar printing except in the 1:2.5 region of the mask, as compared to the conventional assist bar results of FIGS. 16–18.

Application to Two-Dimensional Mask Patterns

Figures 22, 23:
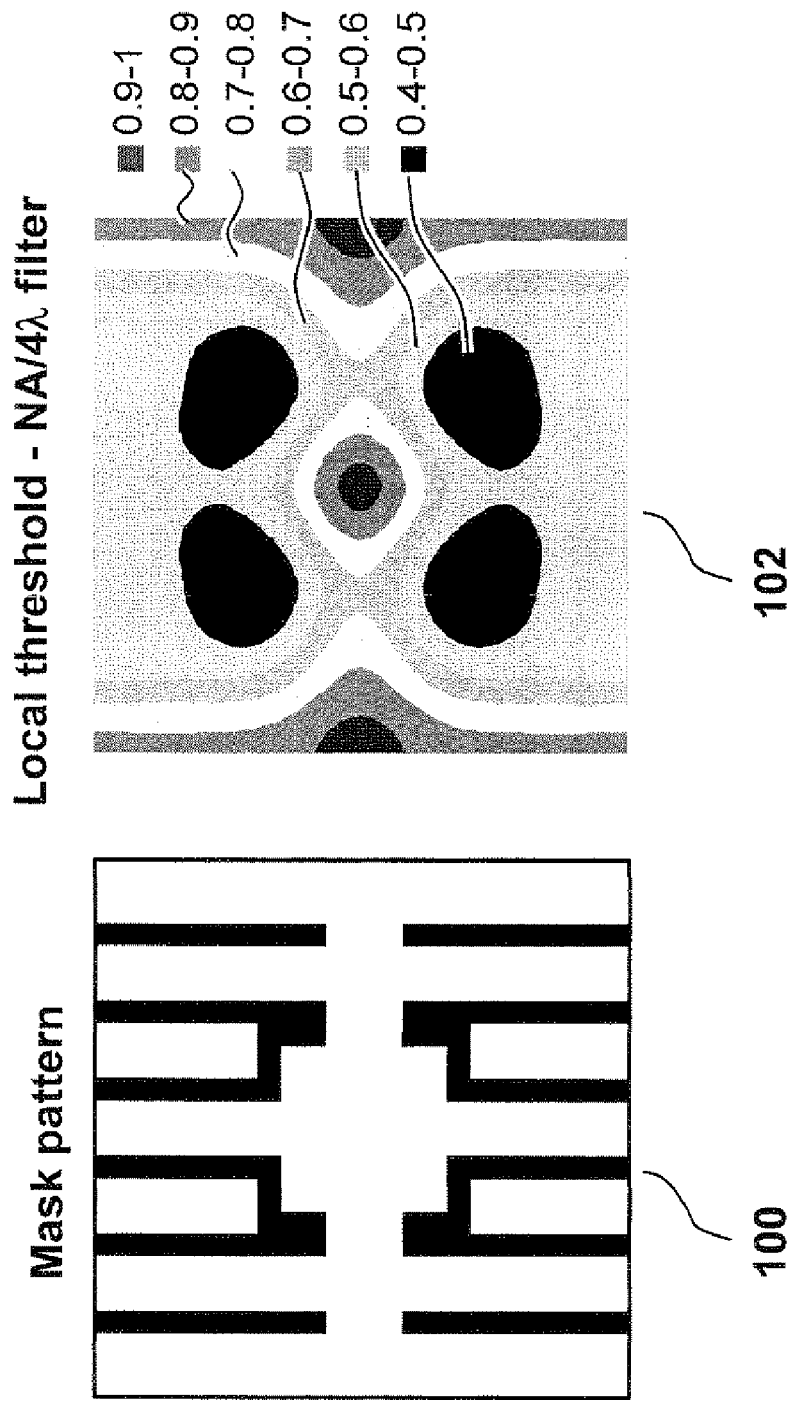
FIG. 22 is an example of a mask pattern.
FIG. 23 is a DC frequency analysis of the pattern of FIG. 22.
Figure 26:
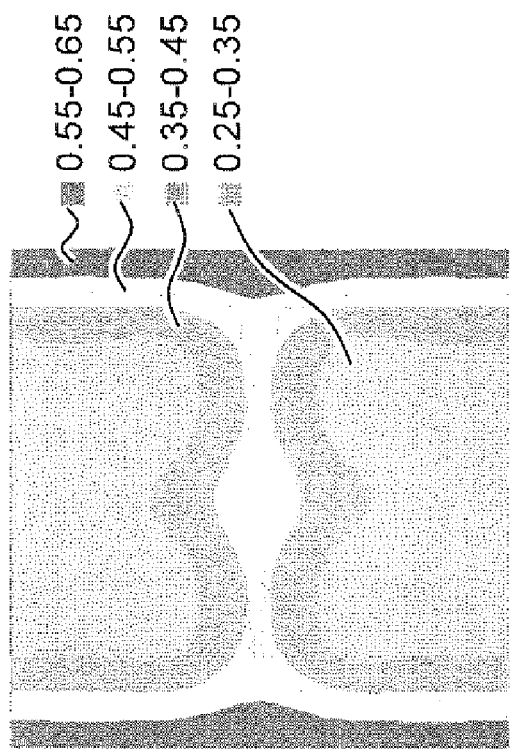
FIG. 26 is a binary representation of FIG. 24.
Figure 27:
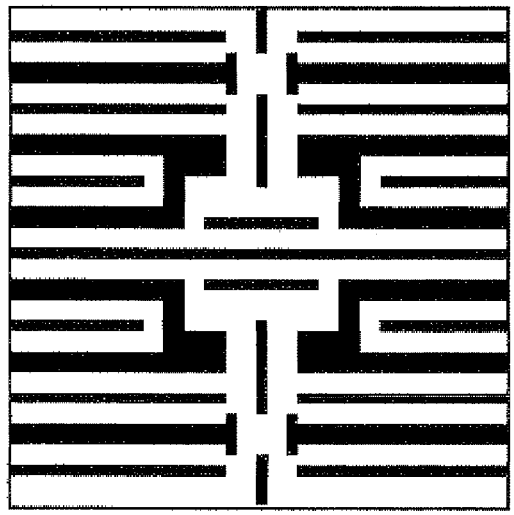
FIG. 27 shows the equalization of FIG. 26.
Figure 28:
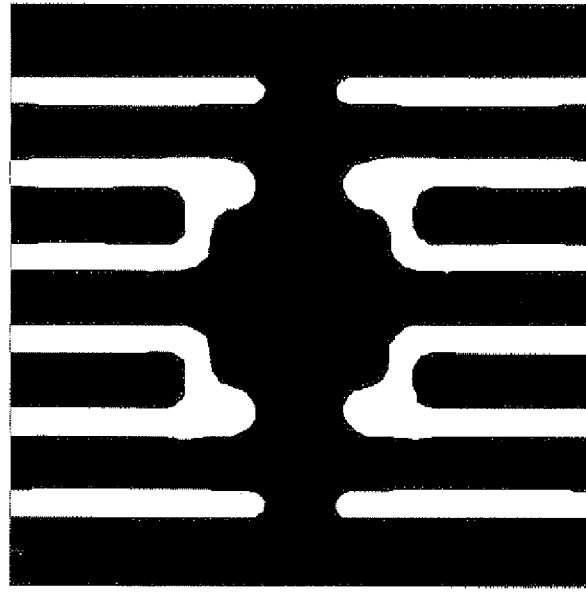
FIG. 28 shows the uncorrected resist pattern.
Figure 29:
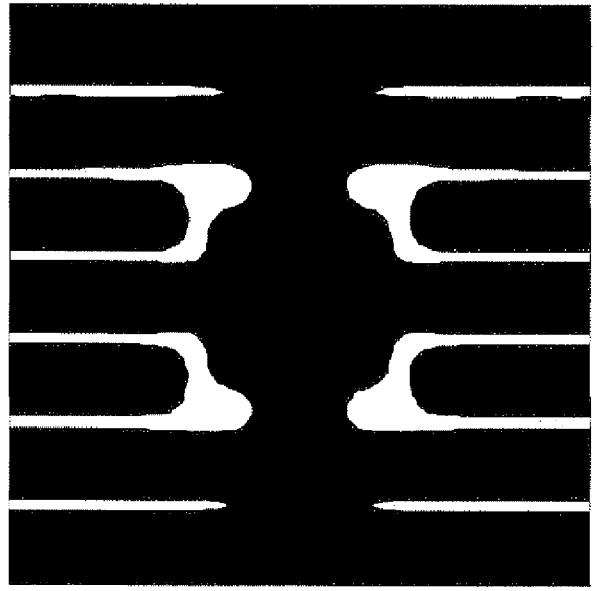
FIG. 29 shows the corrected resist pattern.

The frequency model-based analysis and layout methods described here can be applied to two dimensional mask patterns. As an example, consider the mask pattern 100 in FIG. 22, which is a variation of a common layout example used for demonstration of assist feature OPC. See for instance L. Liebmann et al, "TCAD Development for Lithography Resolution Enhancement," *IBM J. Res. & Dev.*, 25(5), pp. 651–665, 2001. This example contains 130 nm geometry with a duty ratio of 1:2.5. An exposing wavelength of 248 nm is used with 0.75 NA and 0.80σ. When local DC frequency analysis was performed on the pattern using the filtering function described previously, the result was an isofocal intensity distribution 102 shown in FIG. 23. There is no 1:1 geometry included in the mask pattern to equalize intensity toward. In this case, resist thresholding was considered, where a common isofocal intensity value was chosen to match resist response. FIGS. 24 and 25 show two examples. In one case, a 0.32 intensity thresholding resist process 104 was considered. In the second case 106, 0.42 was used. The flexibility to tune the equalization to a resist process is demonstrated. A binary representation of the 0.32 equalized mask 107 was generated using assist feature rules and 30 nm bars. The result is shown in FIG. 26. FIG. 27 shows the effectiveness of the equalization 108, where isofocal intensity in the feature region is contained between 0.25 and 0.35. FIGS. 28 and 29 compare modeled LPM resist images 109,110 (with contrast of 10, resist thickness of 400 nm, absorption of 0.2 μm$^{-1}$, 10 nm diffusion length, and 200 nm defocus). The CD control is evident with absence of any image artifacts from assist features. Resist image 110 more closely resembles the original mask pattern 100 than does the uncorrected resist pattern 109.

Second Embodiment

The second embodiment of the invention utilizes a mask which incorporates small via geometry, also known as contacts. In this case, the isofocal performance of the clear contacts within a dark background is a function of the contact to contact spacing ratio. Contacts of differing pitch values require unique exposure dose values in order to bring the image to the desired size. When contacts of differing pitch exist on a photomask, narrow exposure process latitude exists across all pitch values. This causes a sizing disparities of the contacts based on their pitch (or duty ratio). The situation can be addressed by using the method of the invention.

Figure 30:
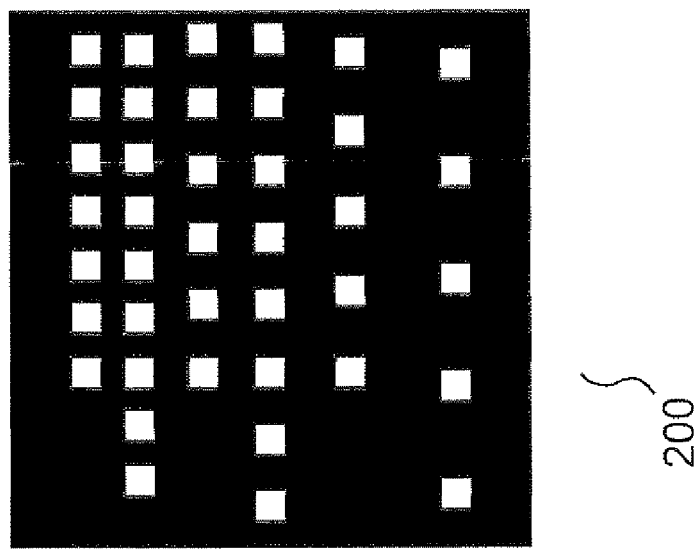
FIG. 30 shows an uncorrected contact mask pattern

FIG. 30 shows the approach for 100 nm contacts that are designed for a photomask 200 with duty ratios ranging from 1:1 (contact to spacing ratio) to 1:3. This example makes use of 193 nm exposure radiation at a numerical aperture of 0.8 and a partial coherence value of 0.5. The goal is to image the contact features of this mask into 250 nm of photoresist so that all contacts at all of these pitch values print into the resist with a consistent sizing, that is with a diameter dimension of 100 nm and variation among the contact images no greater than 10%. The mask design includes several challenges, namely a range of duty ratios and also a variety of proximity circumstances where some contacts are grouped in a closely packed neighborhood and others are sparser. The method of this invention can be used to determine the mask correction necessary to achieve the goals.

Figure 31:
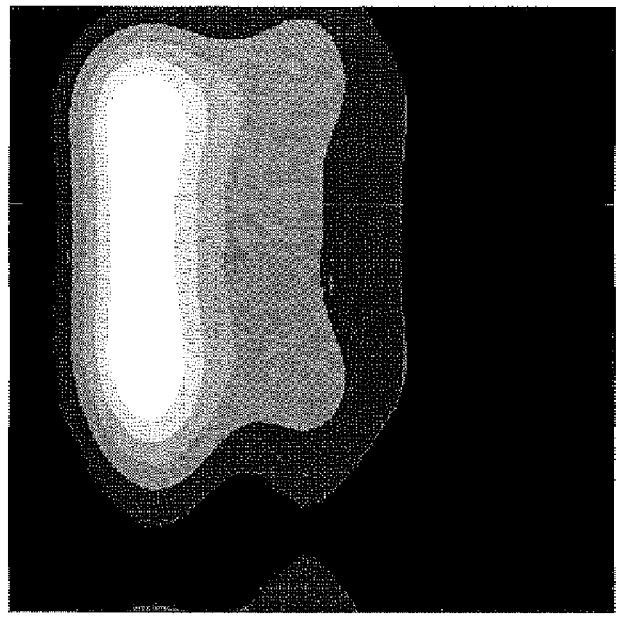
FIG. 31 shows the local zero order energy of the mask of FIG. 30.
Figure 36:
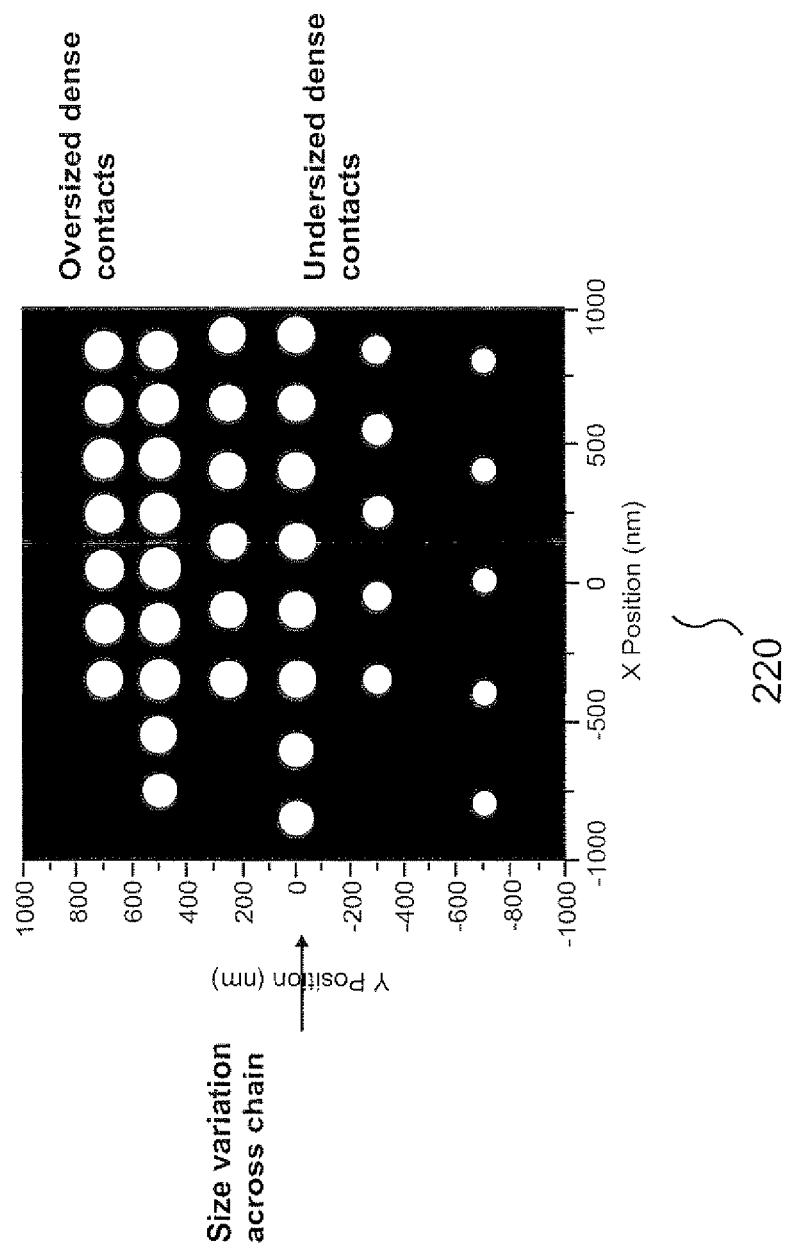
FIG. 36 shows the results without correction.

FIG. 31 shows the local zero order energy 202 resulting from the mask of FIG. 30. The highest energy exists in the region of the densest contacts. The lowest zero order energy exists in the region of the least dense geometry. This variation gives rise to the variation in the contact sizing when imaging into photoresist 220, as seen in FIG. 36. This figure shows lithographic simulation of imaging into a 193 nm photoresist. The resist thickness is 250 nm and a defocus of 150 nm is considered. A sizing dose was used to achieve the targeted 100 nm contact dimension for the dense geometry while maintaining imagability of the less dense images. This goal cannot be achieved as the dense contacts are oversized and the more isolated contacts are undersized. Also, contacts at the end of a "chain" size are smaller as they become more isolated.

Figure 32:
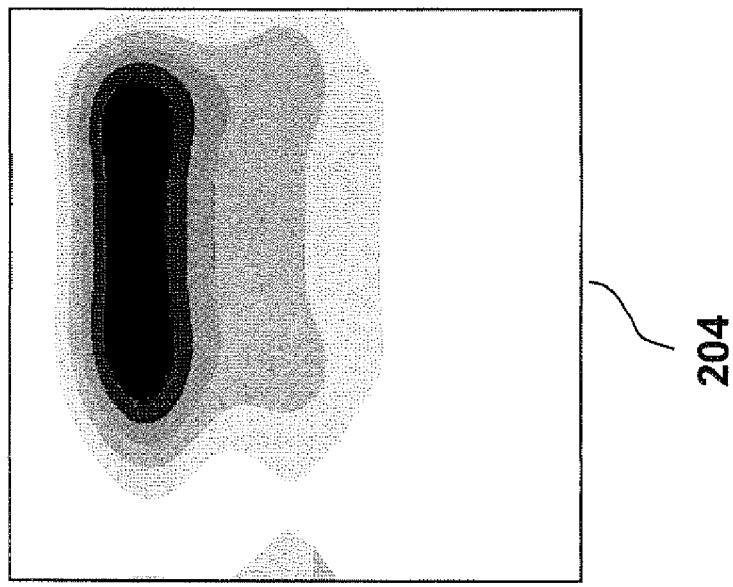
FIG. 32 shows a threshold mask that corrects the local zero order energy of the mask of FIG. 30.

FIG. 32 shows the threshold mask 204 that corrects the local zero order energy of the original mask. As a reciprocal of the local zero order energy function 202, it equalizes the dose across pattern geometry. When combined with the original mask layout, a correction mask function results, which is a continuous tone mask function 206 of FIG. 33. This continuous tone mask function is translated into a binary representation 210, as shown in FIG. 35.

Figure 34:
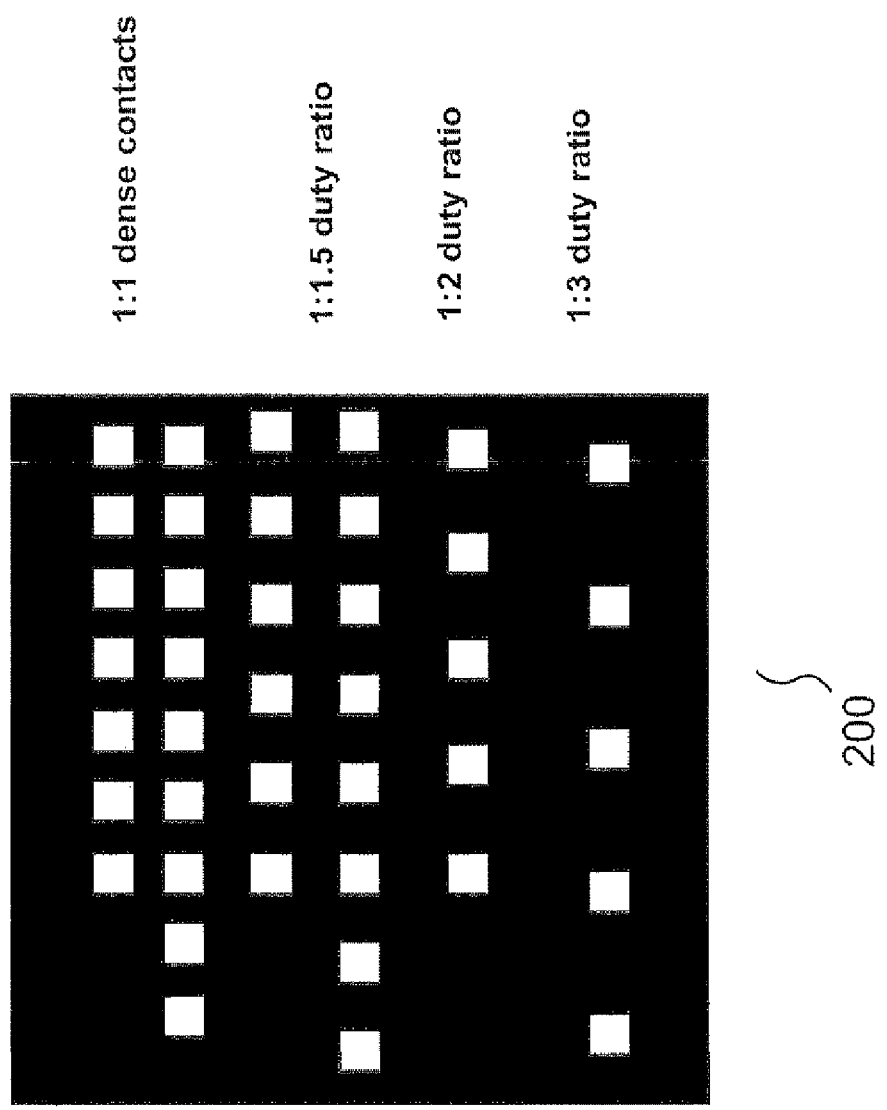
FIG. 34 shows the density of the patterns of FIG. 33.
Figure 35:
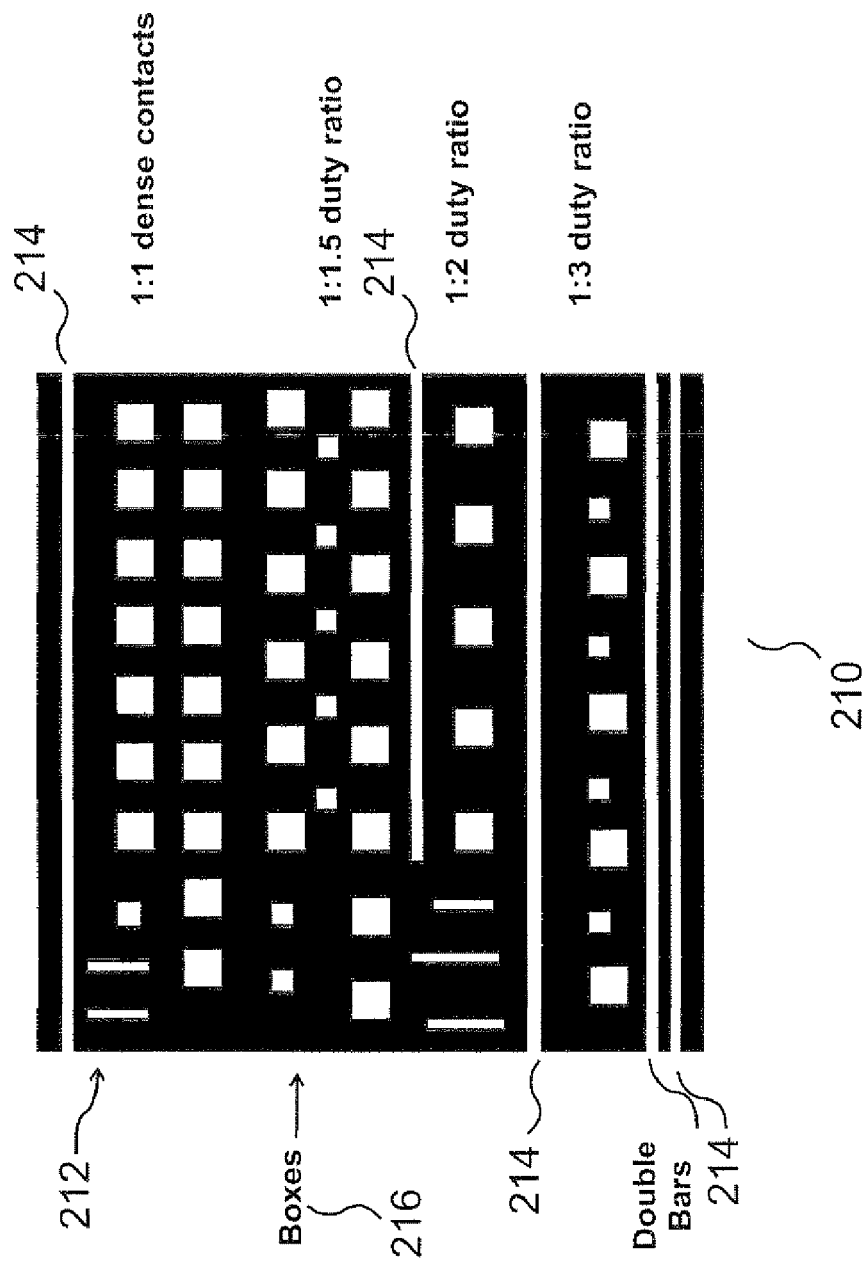
FIG. 35 shows binary correction patterns added to FIG. 34.

FIG. 35 can be compared to FIG. 34 to show the binary correction patterns 210 that have been added to achieve dose equalization across the mask, and therefore allow the printing of images with consistent sizing. Four types of correction features are represented. All types of correction features are deemed themselves to be irresolvable as they are below the resolution capability of the exposure system (generally below 0.25 lambda/NA). Vertical bars 212 are used where there is sufficient room. These bars are implemented as double bars when additional space is available, as with the 1:3 duty ratio region. Horizontal bars 214 are employed to generate the three dimensional nature of the threshold function. Boxes 216 are employed to increase the local zero order in more closely spaced contacts (such as 1:1.5 and greater). The layout of the specific types of correction geometry is carried out through definition of the constraints and parameters of the lithography and mask making system.

Figure 33:
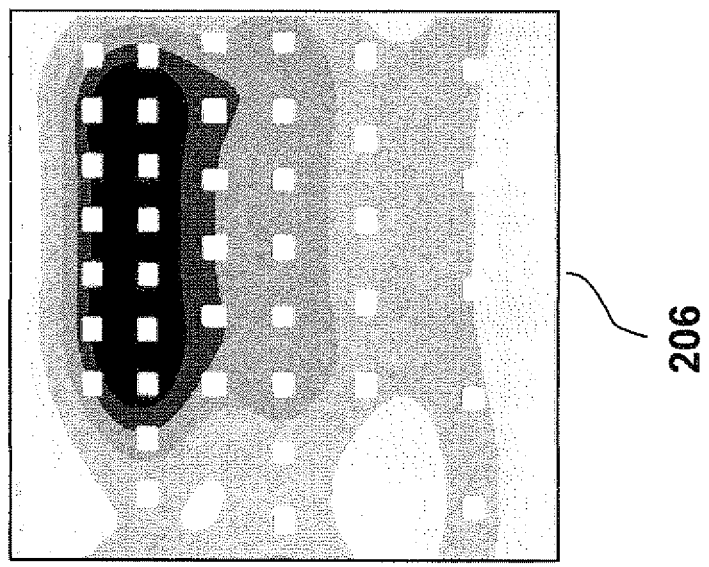
FIG. 33 shows a continuous tone mask function of FIG. 32.
Figure 37:
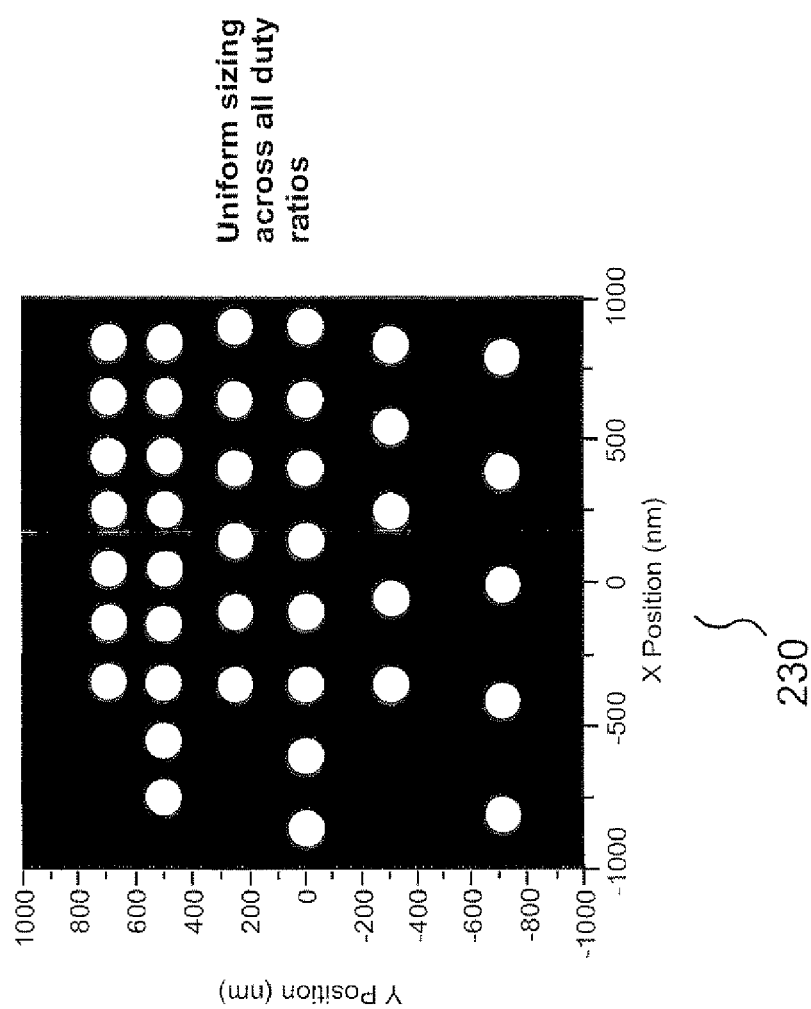
FIG. 37 shows the results with correction.

FIG. 37 shows the result of the corrections employed in FIG. 35 (which are generated from the corrected mask of FIG. 33). This shows how uniform sizing across all duty ratios and proximity situations can be accomplished. The goal of contact sizing of 100 nm within 10% size variation is made possible. The sub-resolution assist features are not imaged. Instead, they reduce the intensity of the imaged features and in particular they reduce the combined intensity of closely spaced features and enhance the intensity of semi-isolated features. By using the reciprocal of the local DC signal analysis and applying that to the mask, the exposure is equalized for most of the features on the mask.

A method for frequency model-based assist feature OPC analysis, optimization, and layout has been introduced using local DC signal analysis. By defining kernel and frequency filtering functions for implementation into a lithography model, imaging specific solutions are possible. The method allows for an increase in the design space of assist feature OPC by considering features that are not necessarily parallel to main features. Examples of one dimensional and two dimensional mask functions have demonstrated the flexibility. The present invention is described above but it is to be understood that it is not limited to these descriptive examples. The numerical values, windowing values, kernel sizing, kernel shapes, mask types, OPC structures, imaging conditions, and methods for spatial frequency analysis and optimization may be changed to accommodate specific conditions of masking, aberration, feature orientation, duty ratio requirements, lens parameters, illumination, and the like as required to achieve high integrated circuit pattern resolution and maximum process latitude. The analytical method for solution is shown as an example and it can also be encoded or incorporated into a lithographic simulator, design layout tool, or other analysis tools.

A method for contact level mask correction is also introduced. The method allows for an increase in the design space of assist feature OPC by considering features that are not necessarily parallel to main features. Examples of one dimensional and two dimensional mask functions and correctors have demonstrated the flexibility. The present invention is described above but it is to be understood that it is not limited to these descriptive examples. The numerical values, types, OPC structures, imaging conditions, and methods for analysis and optimization may be changed to accommodate specific conditions of masking, aberration, feature orientation, duty ratio requirements, lens parameters, phase shift masking (including attenuated phase shift masking), illumination, and the like as required to achieve high integrated circuit pattern resolution and maximum process latitude. The analytical method for solution is shown as an example and it can also be encoded or incorporated into a lithographic simulator, design layout tool, or other analysis tools.

Figure 38:
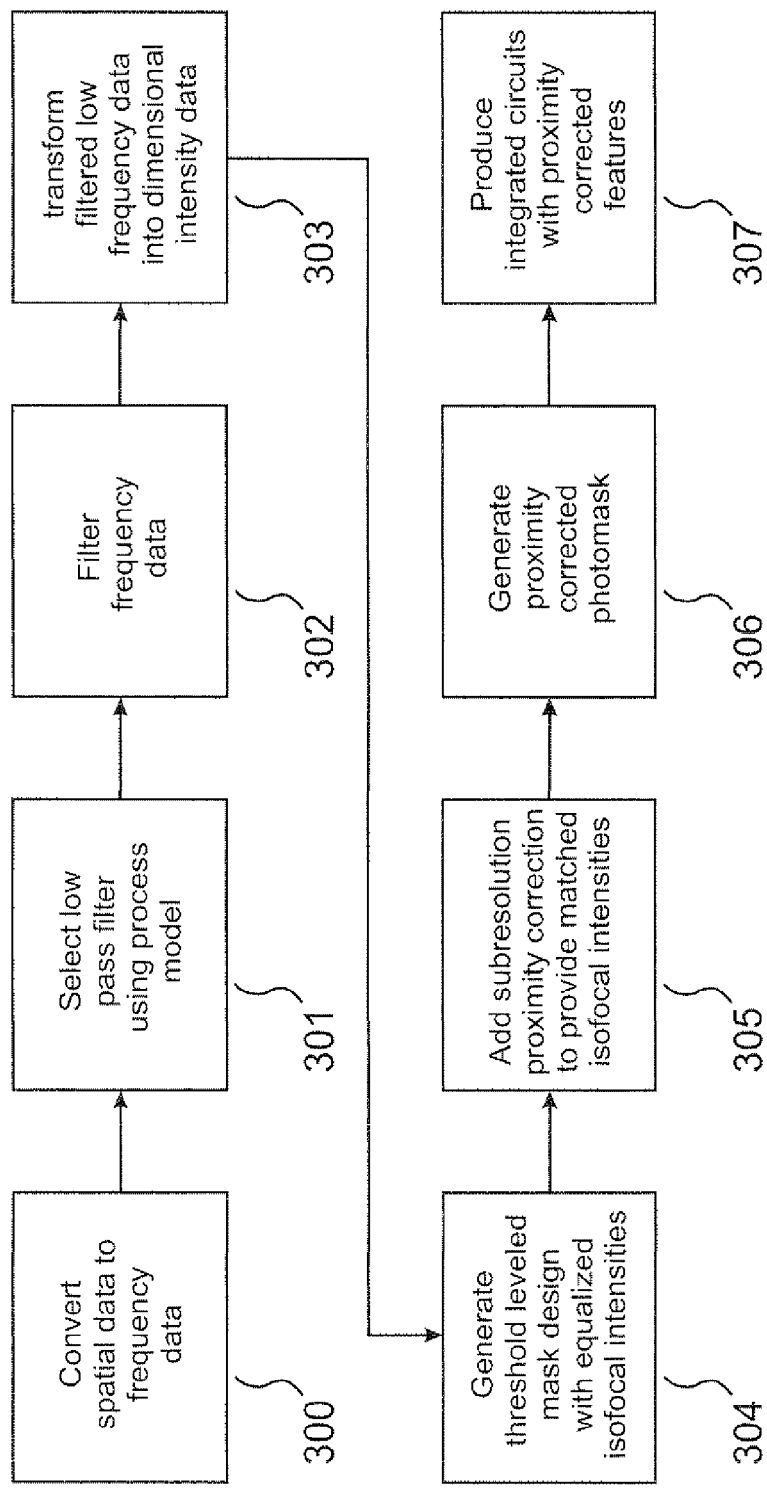
FIG. 38 shows a flow chart of the method of the invention

FIG. 38 shows a flow chart of the operation of the invention. In a first step 300 a photomask has its spatial data including the location and geometries of desired features converted into frequency data. This conversion is carried using a frequency transform operation (such as a Fourier Transform or a Wavelet Transform) or using a lithography model (such as Prolith version 7). Those skilled in the art understand the manner in which such a tool can perform this conversion. In step 301, a kernel of a size larger than the pitch of the densest features and less than the pitch of the critical semi-isolated features is defined using a process model selected that corresponds to the resist and lithography tools. A suitable low frequency filter is created from this kernal through a Fourier Transform or Wavelet Transform operation. The converted data of step 300 is operated on in step 302 by the filter of step 301 where the frequency data is low frequency filtered. This operation becomes local to the spatial data. This means that the only lowest frequency information is preserved in the local regions of the original spatial data. The low frequency data is next transformed into dimensional intensity data in step 303. This provides data regarding the localized intensities of the low frequency aspect of the original spatial data. The semi-isolated features usually have higher low frequency intensities than the dense features. The next step 304 generates a threshold leveled mask design that equalizes the intensities of the different frequencies based on the local low frequency intensity data. In most cases the higher intensities of the lower frequencies (semi-isolated features) are reduced. As such the dense features are normalized to and have no reduction while the other features are reduced to provide an equal or near equal intensities. This is especially important as the features are subjected to defocus. The result may be a gray level mask that may be difficult to manufacture. As an alternative, the local area is pixilated with sub-resolution bars, ladders or boxes to provide local proximity corrections on the mask that will produce intensity results nearly identical to the gray levels. The sub-resolution features are added in step 305 in accordance to the level of intensity reduction determined by step 304. The sub-resolution features are added in step 305 also in accordance to the constraints provided by the mask making process and also by the imaging process, where it is not desirable to image the sub-resolution features themselves. This addition is made to the software program that controls the features on the mask. Thereafter, a photomask with proximity corrected features is generated in step 306 using conventional photomask making equipment and processes. Then in step 307 integrated circuits are made using the photomask with local proximity corrections.

Those skilled in the art understand that the size, configuration and orientation of the correcting features have certain limitations. The correction features are small enough so that they are not imaged but large enough that they can be manufactured. The invention does not rely upon any one size or shape of correction feature as such sizes and shapes depend upon the mask features, their spacing and other parameters. Whether boxes, bars or ladders are used is a matter of design choice and experimentation. The invention provides a method that can work for all masks where the DC level of signal for the numerous mask features is converted into a threshold mask that is then corrected by pixilation to even out the intensity of the features by adding sub-resolution correction features.

REFERENCES

1. J. F. Chen U.S. Pat. No. 5,242,770.
2. S. Mansfield, L. Liebmann, A. Molless, and A. Wong, "Lithographic Comparison of Assist Feature Design Stratagies," *Proc. SPIE* 4000, pp. 63–76, 2000.
3. B. W. Smith, "Mutual Optimization of Resolution Enhancement Techniques", *J. of Microlithography, Microfabrication, and Microsystems,* 2, 2002.
4. B. W. Smith, "Mutual Optimization of Resolution Enhancement Techniques," *Proc SPIE* 4348, 2001.
5. J. P. Stirnman, M. L. Rieger, "Fast Proximity Correction with Zone Sampling," Proc. SPIE 2197, pp. 294–376, 1994.
6. Simulations were carried out using lithography vector image models and lumped parameter models in Prolith v. 7.0.
7. L. Liebmann et al, "TCAD Development for Lithography Resolution Enhancement," *IBM J. Res. & Dev.,* 25(5), pp. 651–665, 2001.

What I claim is:

1. A method of photomask design layout comprising the steps of:
    transforming photomask dimensional design data into spatial frequency data using a frequency transforming operation;
    creating a process model for a low-pass filter where the process model correlates to photomask design geometry and lithographic imaging conditions;
    filtering frequency representation of the dimensional design data with the low-pass filter across features having a variable proximity to one another ranging from a dense proximity to a semi-isolated proximity;
    transforming the filtered frequency representation of the dimensional design data into filtered dimensional design data using an inverse frequency transforming operation;
    creating a dose equalization function corresponding to a normalized reciprocal map of the filtered dimensional design data;
    creating a threshold leveled photomask design with equalized isofocal intensity values for filtered dimensional design data using the dose equalization function;
    generating a proximity corrected photomask comprising proximity mask corrections using the photomask design with equalized isofocal intensity values;
    using the proximity corrected photomask in a lithography exposure system to produce proximity corrected patterns on a imaged substrate.

2. The method of claim 1 wherein the photomask pattern contains lines and spaces.

3. The method of claim 1 wherein the photomask pattern contains islands or contact holes.

4. The method of claim 1 wherein the proximity mask corrections are vertical bars, horizontal bars, boxes, and grouped bars.

5. The method of claim 1 wherein the low-pass filter is from a group comprising circles, Gausian functions, sine functions, square functions, and Besinc functions.

6. The method of claim 1 wherein the frequency transforming operation is a Fourier Transform.

7. The method of claim 1 wherein the frequency transforming operation is a Wavelet Transform.

8. A method of photomask design layout comprising the steps of:
    transforming photomask dimensional design data into spatial frequency data using a Cosine transforming operation;
    creating a process model for a low-pass filter where the process model correlates to photomask design geometry and lithographic imaging conditions;
    filtering frequency representation of the dimensional design data with the low-pass filter across features having a variable proximity to one another ranging from a dense proximity to a semi-isolated proximity;
    transforming the filtered frequency representation of the dimensional design data into filtered dimensional design data using an inverse Cosine transforming operation;
    creating a dose equalization function corresponding to a normalized reciprocal map of the filtered dimensional design data;
    creating a threshold leveled photomask design with equalized isofocal intensity values for filtered dimensional design data using the dose equalization function;
    generating a proximity corrected photomask comprising proximity mask corrections using the photomask design with equalized isofocal intensity values;
    using the proximity corrected photomask in a lithography exposure system to produce proximity corrected patterns on a imaged substrate.

9. The method of claim 1 wherein the frequency transforming operation is within a partially coherent scalar diffraction imaging model.

10. The method of claim 1 wherein the frequency transforming operation is within a partially coherent vector diffraction imaging model.

11. The method of claim 1 wherein the frequency transforming operation includes the effects of illumination.

12. The method of claim 1 wherein the frequency transforming operation includes the effects of lens aberrations.

13. The method of claim 1 wherein the optical proximity mask corrections are added to decrease the isofocal intensity of semi-isolated line features.

14. The method of claim 1 wherein the optical proximity mask corrections are added to increase the isofocal intensity of semi-isolated contact features.

15. The method of claim 1 wherein the optical proximity mask corrections are added to increase the isofocal intensity of semi-isolated space features.

16. A system for computing the steps of photomask design layout proximity correction using a computer system comprising;
   a central processing unit for the computation of proximity corrections;
   a memory storing computer instructions for the computation of proximity corrections, wherein when the computer instructions are executed on the central processing unit, they perform a process for proximity correction comprising the steps of:
   transforming photomask dimensional design data into spatial frequency data using a frequency transforming operation;
   creating a process model for a low-pass filter where the process model correlates to photomask design geometry and lithographic imaging conditions;
   filtering frequency representation of the dimensional design data with the low-pass filter across features having a variable proximity to one another ranging from a dense proximity to a semi-isolated proximity;
   transforming the filtered frequency representation of the dimensional design data into filtered dimensional design data using an inverse frequency transforming operation;
   creating a dose equalization function corresponding to a normalized reciprocal map of the filtered dimensional design data;
   creating a threshold leveled photomask design with equalized isofocal intensity values for filtered dimensional design data using the dose equalization function;
   and generating proximity mask corrections wherein a proximity corrected photomask design with proximity mask corrections is saved in a file which is used to produce proximity corrected patterns on a imaged substrate.

17. A method for equalizing intensity of exposure of a photolithographic mask having dense and semi-isolated features comprising:
   generating a partially coherent distribution of frequencies;
   low frequency filtering the frequencies to generate an image of a local DC signal across a mask field, wherein said mask field includes features having a variable proximity to one another ranging from a dense proximity to a semi-isolated proximity;
   generating a gray level complimentary mask for equalizing intensity of images of the mask features in accordance with the local DC signal across the mask field; and
   pixellating the mask with binary assist features that correspond to the gray levels to equalize the intensity of images of the mask features in accordance with the image of the local DC signal across the mask field.

18. A method for improving a photomask comprising the steps of:
   transforming a photomask pattern, including features having a variable proximity to one another ranging from a dense proximity to a semi-isolated proximity, from the photomask spatial domain to a frequency domain;
   filtering the frequency domain with a low pass filter to identify low frequency contributions from the photomask pattern;
   identifying the differences of contributions from the features and generating corrections to match the low frequency contributions from all the mask patterns;
   converting the corrections to sub-resolution features and inserting the sub-resolution features into the photomask to match zero order diffractions of light through the mask so that dense and semi-isolated features are more evenly exposed.

19. The method of claim 18 wherein the step of transforming the photomask pattern comprises operating on the photomask pattern with a frequency transform selected from the group consisting of Fourier transforms, wavelet transforms, and cosine transforms.

20. The method of claim 18 comprising the further step of generating a threshold leveled mask of equalized isofocal intensity after identifying the different contributions from the mask patterns.

21. The method of claim 18 comprising the step of converting the threshold leveled mask into a proximity corrected mask with sub-resolution features for locally controlling the threshold of the photomask.

* * * * *